US010658404B2

(12) United States Patent
Abe et al.

(10) Patent No.: US 10,658,404 B2
(45) Date of Patent: May 19, 2020

(54) SOLID STATE IMAGING DEVICE AND IMAGING APPARATUS WITH PIXEL COLUMN HAVING MULTIPLE OUTPUT LINES

(71) Applicant: SONY CORPORATION, Tokyo (JP)

(72) Inventors: Takashi Abe, Kanagawa (JP); Nobutaka Shimamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/124,860

(22) PCT Filed: Mar. 13, 2015

(86) PCT No.: PCT/JP2015/057528
§ 371 (c)(1),
(2) Date: Sep. 9, 2016

(87) PCT Pub. No.: WO2015/146642
PCT Pub. Date: Oct. 1, 2015

(65) Prior Publication Data
US 2017/0125464 A1 May 4, 2017

(30) Foreign Application Priority Data

Mar. 26, 2014 (JP) .................................. 2014-064007

(51) Int. Cl.
*H01L 31/062* (2012.01)
*H01L 31/113* (2006.01)
(Continued)

(52) U.S. Cl.
CPC .... *H01L 27/14603* (2013.01); *H01L 27/1469* (2013.01); *H01L 27/14612* (2013.01);
(Continued)

(58) Field of Classification Search
CPC .......... H01L 27/14603; H01L 27/1469; H01L 27/14634; H01L 27/14636; H01L 27/14612; H01L 27/14643; H04N 5/3741
See application file for complete search history.

(56) References Cited

U.S. PATENT DOCUMENTS 8,570,416 B2 * 10/2013 Araki ................ H01L 27/14643
348/308
2008/0258042 A1 * 10/2008 Krymski ................ H04N 3/155
250/208.1
(Continued)

FOREIGN PATENT DOCUMENTS

CN 103220475 7/2013
JP 4-113625 A 4/1992
(Continued)

OTHER PUBLICATIONS

International Search Report prepared by the Japan Patent Office dated Apr. 17, 2015, for International Application No. PCT/JP2015/057528.
(Continued)

*Primary Examiner* — Ismail A Muse
(74) *Attorney, Agent, or Firm* — Sheridan Ross P.C.

(57) ABSTRACT

The present technology relates to a solid state imaging device capable of providing a solid state imaging device that does not cause deterioration of image quality due to an increase in reading speed of a pixel signal, and an imaging apparatus. In a pixel array block in which a plurality of pixels are two-dimensionally arrayed, each of the pixels including: a photoelectric conversion device; a plurality of transistors to be used for reading a signal from the photoelectric conversion device; and wiring for driving the transistors, a plurality of pixel output lines are provided for each one column of the plurality of pixels two-dimensionally arrayed, and the plurality of pixel output lines from the
(Continued)

pixels are arranged separately in a plurality of wiring layers. The present technology can be applied to, for example, a CMOS image sensor.

14 Claims, 15 Drawing Sheets

(51) Int. Cl.
*H01L 27/146* (2006.01)
*H04N 5/374* (2011.01)

(52) U.S. Cl.
CPC .. *H01L 27/14634* (2013.01); *H01L 27/14636* (2013.01); *H01L 27/14643* (2013.01); *H04N 5/3741* (2013.01)

(56) References Cited

U.S. PATENT DOCUMENTS

| | | | |
|---|---|---|---|
| 2009/0295979 | A1 | 12/2009 | Matsuo et al. |
| 2009/0322917 | A1* | 12/2009 | Kyogoku .......... H01L 27/14621 348/273 |
| 2010/0039545 | A1* | 2/2010 | Ishiwata .......... H01L 27/14603 348/308 |
| 2010/0271522 | A1* | 10/2010 | Matsunaga .......... H04N 5/2176 348/302 |
| 2010/0271523 | A1* | 10/2010 | Hara .............. H04N 5/367 348/302 |
| 2011/0128426 | A1* | 6/2011 | Taruki ............ H04N 5/341 348/300 |
| 2011/0298908 | A1* | 12/2011 | Murakami ........ A61B 1/00009 348/65 |
| 2013/0182163 | A1* | 7/2013 | Kobayashi ....... H01L 27/14601 348/302 |
| 2014/0016006 | A1* | 1/2014 | Tashiro ........... H04N 5/3741 348/281 |
| 2014/0239154 | A1* | 8/2014 | Chen ............. H04N 5/335 250/208.1 |
| 2014/0300787 | A1* | 10/2014 | Nakaseko ........ H04N 5/343 348/296 |
| 2014/0320713 | A1* | 10/2014 | Egawa ........... H04N 5/355 348/301 |
| 2014/0333810 | A1* | 11/2014 | Nakaseko ....... H04N 5/341 348/294 |
| 2015/0077605 | A1* | 3/2015 | Takada .......... H01L 27/148 348/300 |
| 2015/0181138 | A1* | 6/2015 | Oike ........... H01L 27/14634 348/308 |
| 2015/0256760 | A1* | 9/2015 | Ju .............. H04N 5/243 348/256 |
| 2015/0271427 | A1* | 9/2015 | Okano .......... H04N 5/3653 348/301 |
| 2015/0350575 | A1* | 12/2015 | Agranov ........ H04N 5/3458 348/302 |
| 2016/0006923 | A1* | 1/2016 | Imamura ........ H04N 5/23209 348/208.11 |
| 2016/0037100 | A1* | 2/2016 | Ino ............. H04N 5/217 348/241 |
| 2016/0326580 | A1* | 11/2016 | Rothberg ....... C12Q 1/6869 |
| 2016/0329375 | A1* | 11/2016 | Imoto .......... H01L 27/1463 |

FOREIGN PATENT DOCUMENTS

| | | |
|---|---|---|
| JP | 10-93032 A | 4/1998 |
| JP | 2003-282735 A | 10/2003 |
| JP | 2004-119457 A | 4/2004 |
| JP | 2005-228956 A | 8/2005 |
| JP | 2006-100307 A | 4/2006 |
| JP | 2006-270292 A | 10/2006 |
| JP | 2011-114843 A | 6/2011 |
| JP | 2013-041915 | 2/2013 |
| JP | 2013-168634 A | 8/2013 |

OTHER PUBLICATIONS

Official Action (with English translation) for Chinese Patent Application No. 201580012575.8, dated Oct. 10, 2018, 17 pages.
Official Action (with English translation) for Chinese Patent Application No. 201580012575.8, dated May 29, 2019, 16 pages.

* cited by examiner

SOLID STATE IMAGING DEVICE AND IMAGING APPARATUS WITH PIXEL COLUMN HAVING MULTIPLE OUTPUT LINES

CROSS REFERENCE TO RELATED APPLICATIONS

This application is a national stage application under 35 U.S.C. 371 and claims the benefit of PCT Application No. PCT/JP2015/057258 having an international filing date of 13 Mar. 2015, which designated the United States, which PCT application claimed the benefit of Japanese Patent Application No. 2014-064007 filed 26 Mar. 2014, the disclosures of which are incorporated herein by reference in their entirety.

TECHNICAL FIELD

The present technology relates to a solid state imaging device and an imaging apparatus, and in particular relates to a solid state imaging device capable of providing a solid state imaging device that does not cause deterioration of image quality due to an increase in reading speed of a pixel signal, and the imaging apparatus.

BACKGROUND ART

Conventionally, a solid state imaging device such as a Complementary Metal Oxide Semiconductor (CMOS) image sensor has been widely used for an imaging apparatus such as a digital still camera. The solid state imaging device has a pixel array block in which a plurality of pixels are two dimensionally arrayed, each of the pixels including a photodiode (PD) as a photoelectric conversion device and a plurality of transistors, and incident light is photoelectrically converted in each of the pixels (for example, see Patent Document 1).

CITATION LIST

Patent Document

Patent Document 1: Japanese Patent Application Laid-Open No. 2013-41915

SUMMARY OF THE INVENTION

Problems to be Solved by the Invention

In recent years, demand has become stronger for an increase in reading speed of a pixel signal from pixels, in a solid state imaging device such as a CMOS image sensor.

The present technology has been made in view of such a circumstance, and provides a solid state imaging device that does not cause deterioration of image quality due to the increase in reading speed of the pixel signal from the pixels.

Solutions to Problems

A solid state imaging device of a first aspect of the present technology is a solid state imaging device including a pixel array block in which a plurality of pixels are two-dimensionally arrayed, each of the pixels including: a photoelectric conversion device; a plurality of transistors to be used for reading a signal from the photoelectric conversion device; and wiring for driving the transistors, wherein, in the pixel array block, a plurality of pixel output lines are provided for each one column of the plurality of pixels two-dimensionally arrayed, and the plurality of pixel output lines from the pixels are arranged separately in a plurality of wiring layers.

Pixel output lines adjacent to each other of the plurality of pixel output lines can be respectively arranged in different wiring layers.

Pixel output lines adjacent to each other of the plurality of pixel output lines can be respectively arranged to be switched alternately in a first wiring layer and a second wiring layer.

A pixel output line arranged in the closest position to wiring of floating diffusion of the plurality of pixel output lines can be arranged in a different wiring layer from a wiring layer of the floating diffusion.

Structure can be included in which, between the first wiring layer and the second wiring layer in which the plurality of pixel output lines are arranged, another wiring layer is sandwiched.

Shield wiring can be arranged in the other wiring layer.

Power supply wiring or ground wiring and the pixel output line can be arranged in the first wiring layer to be in the same direction in a vertical direction or a horizontal direction, and can be arranged in a direction perpendicular to given wiring arranged in the second wiring layer in which the pixel output line is not arranged.

Dummy wiring can be arranged in the periphery of the pixel output lines respectively arranged in different wiring layers, in order to make load capacitance of the pixel output lines uniform.

Intervals between the pixel output lines can be different from each other for each wiring layer in which the pixel output lines are arranged.

The pixel output lines can be respectively wired to be switched alternately in different wiring layers via a contact.

A cycle of switching of wiring can be changed such that wiring layers of the pixel output lines adjacent to each other of the plurality of pixel output lines are different from each other.

Shield wiring can be arranged between a pixel output line arranged in the closest position to wiring of floating diffusion of the plurality of pixel output lines and the wiring of the floating diffusion.

In the solid state imaging device of the first aspect of the present technology, in the pixel array block in which a plurality of pixels are two-dimensionally arrayed, each of the pixels including: a photoelectric conversion device; a plurality of transistors to be used for reading a signal from the photoelectric conversion device; and wiring for driving the transistors, a plurality of pixel output lines are provided for each one column of the plurality of pixels two-dimensionally arrayed, and the plurality of pixel output lines from the pixels are arranged separately in the plurality of wiring layers.

An imaging apparatus of a second aspect of the present technology is an imaging device mounting a solid state imaging device including a pixel array block in which a plurality of pixels are two-dimensionally arrayed, each of the pixels including: a photoelectric conversion device; a plurality of transistors to be used for reading a signal from the photoelectric conversion device; and wiring for driving the transistors, wherein, in the pixel array block, a plurality of pixel output lines are provided for each one column of the plurality of pixels two-dimensionally arrayed, and the plurality of pixel output lines from the pixels are arranged separately in a plurality of wiring layers.

In the imaging apparatus of the second aspect of the present technology, the solid state imaging device is mounted in which, in the pixel array block in which a plurality of pixels are two-dimensionally arrayed, each of the pixels including: a photoelectric conversion device; a plurality of transistors to be used for reading a signal from the photoelectric conversion device; and wiring for driving the transistors, a plurality of pixel output lines are provided for each one column of the plurality of pixels two-dimensionally arrayed, and the plurality of pixel output lines from the pixels are arranged separately in the plurality of wiring layers.

Effects of the Invention

With the first aspect and the second aspect of the present technology, it is possible to provide the solid state imaging device that does not cause deterioration of image quality due to the increase in reading speed of the pixel signal.

Incidentally, the effect described here is not necessarily limited, and can be any effect described in the present disclosure.

MODE FOR CARRYING OUT THE INVENTION

Hereinafter, embodiments of the present technology are described with reference to the drawings. However, description is made in the following order.
1. Influence caused by increase in wiring density
2. System configuration
3. Wiring structure of pixel
   (1) First embodiment: basic wiring structure
   (2) Second embodiment: wiring structure using dummy wiring
   (3) Third embodiment: wiring structure in which interval of pixel output lines is adjusted
   (4) Fourth embodiment: wiring structure using shield wiring
   (5) Fifth embodiment: wiring structure using shield wiring layer
   (6) Sixth embodiment: wiring structure in which wiring layers are alternately switched at constant intervals
   (7) Seventh embodiment: wiring structure in which pixel output lines are arranged after rearranging wiring structure
   (8) Eighth embodiment: wiring structure in which a plurality of pixel output lines are arranged in a plurality of wiring layers
4. Configuration of electronic equipment <1. Influence Caused by Increase in Wiring Density>

Figure 1:
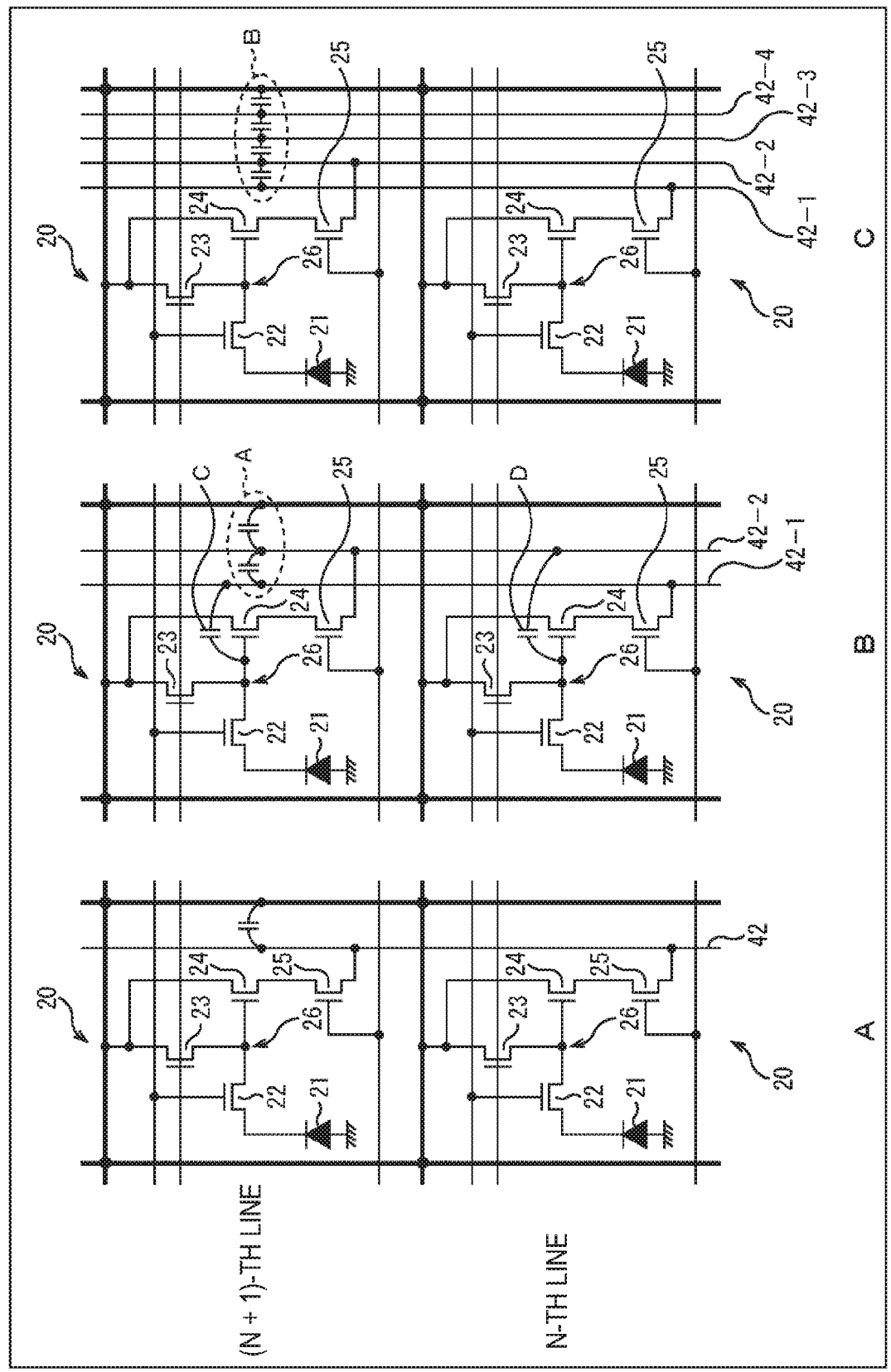
FIG. 1 is a diagram describing influence caused by an increase in wiring density in pixel structure in which a plurality of pixel output lines are provided per one column.

FIG. 1 illustrates a configuration of pixels 20 of an N-th line and an (N+1)-th line in a pixel array block. As illustrated in A of FIG. 1, in each of the pixels 20, a charge photoelectrically converted in a photoelectric conversion device 21 and accumulated is transferred to floating diffusion (FD) 26 being a floating diffusion region via a transfer transistor 22.

Then, the charge accumulated in the floating diffusion 26 is converted into a pixel signal depending on its level by an amplifying transistor 24, and a pixel signal selected by a selection transistor 25 is output via a pixel output line 42. Incidentally, in each of the pixels 20, a reset transistor 23 is provided for resetting a gate electrode potential of the amplifying transistor 24.

Here, in each of the pixels 20, reading speed of the pixel signal can be increased by increasing the number of pixel output lines 42 connected to the selection transistor 25. In a configuration of B of FIG. 1, two pixel output lines 42 are provided for the pixels 20 of each column, and, for example, the selection transistor 25 in the pixel 20 of the N-th line is connected to a pixel output line 42-1, and the selection transistor 25 in the pixel 20 of the (N+1)-th line is connected to a pixel output line 42-2. Thus, in the configuration of B of FIG. 1, it becomes possible to read the pixel signal at double speed compared to the case of A of FIG. 1 in which there is one pixel output line 42.

In addition, in a configuration of C of FIG. 1, four pixel output lines 42 are provided for the pixels 20 of each column, and the selection transistor 25 in the pixel 20 of each row is connected to any of the pixel output lines 42-1 to 42-4. Thus, in the configuration of C of FIG. 1, it becomes possible to read the pixel signal at higher speed compared to the configuration of B of FIG. 1 in which two pixel output lines 42 are provided.

Meanwhile, as illustrated in FIG. 1, reading speed of the pixel signal can be increased by providing the plurality of pixel output lines 42 per one column; however, wiring density is increased and various influences come out by providing the plurality of pixel output lines 42 per one column. In particular, in a case in which downsizing of a cell is progressed, limitation in layout is increased, and influence in a characteristic comes out even if the layout is possible.

That is, due to shortening of a distance between the pixel output lines 42, parasitic capacitance of the wiring is increased, and RC delay is increased. In addition, for example, as illustrated in C of FIG. 1, in the case in which four pixel output lines 42-1 to 42-4 are arranged, since the pixel output lines 42-2, 42-3 are sandwiched by the other pixel output lines 42, the parasitic capacitance is increased to the pixel output lines 42-1, 42-4. Further, due to occurrence of a parasitic capacitance difference between the plurality of pixel output lines 42, a difference is caused between output characteristics, and it becomes a factor that causes image quality deterioration such as lateral stripes.

In addition, for example, as illustrated in "A" of B of FIG. 1 and "B" of C of FIG. 1, electrical color mixing may be caused by coupling between wirings. Further, coupling capacitance with the other node is increased by an increase in wiring density. In addition, for example, as illustrated in B of FIG. 1, by providing the plurality of pixel output lines 42, a distance between wirings cannot be sufficiently increased, and a coupling capacitance C is increased between the floating diffusion 26 and the pixel output line 42-1, and it becomes a factor that worsens the electrical color mixing.

Further, due to changing of a coupling capacitance between the floating diffusion 26 and the pixel output line 42 depending on a physical distance to the pixel output line 42, deterioration of the image quality may be caused. For example, as illustrated in B of FIG. 1, when the coupling capacitance C between the pixel output line 42-1 and the floating diffusion 26 in the pixel 20 of the (N+1)-th line and a coupling capacitance D between the pixel output line 42-2 and the floating diffusion 26 in the pixel 20 of the N-th line are compared with each other, since the pixel output line 42-1 is physically closer in distance, the coupling capacitance C is greater, and a difference of an amount of color mixing may appear as image quality deterioration such as the lateral stripes on the screen.

Accordingly, in a CMOS image sensor to which the present technology is applied, influence caused by an increase in wiring density can be avoided in pixel structure in which the plurality of pixel output lines are provided per one column as described above. Hereinafter, the CMOS image sensor is described to which the present technology is applied.

<2. System Configuration>
(Configuration Example of CMOS Image Sensor)
FIG. 2 is a diagram illustrating a configuration example of the CMOS image sensor to which the present technology is applied.

Figure 2:
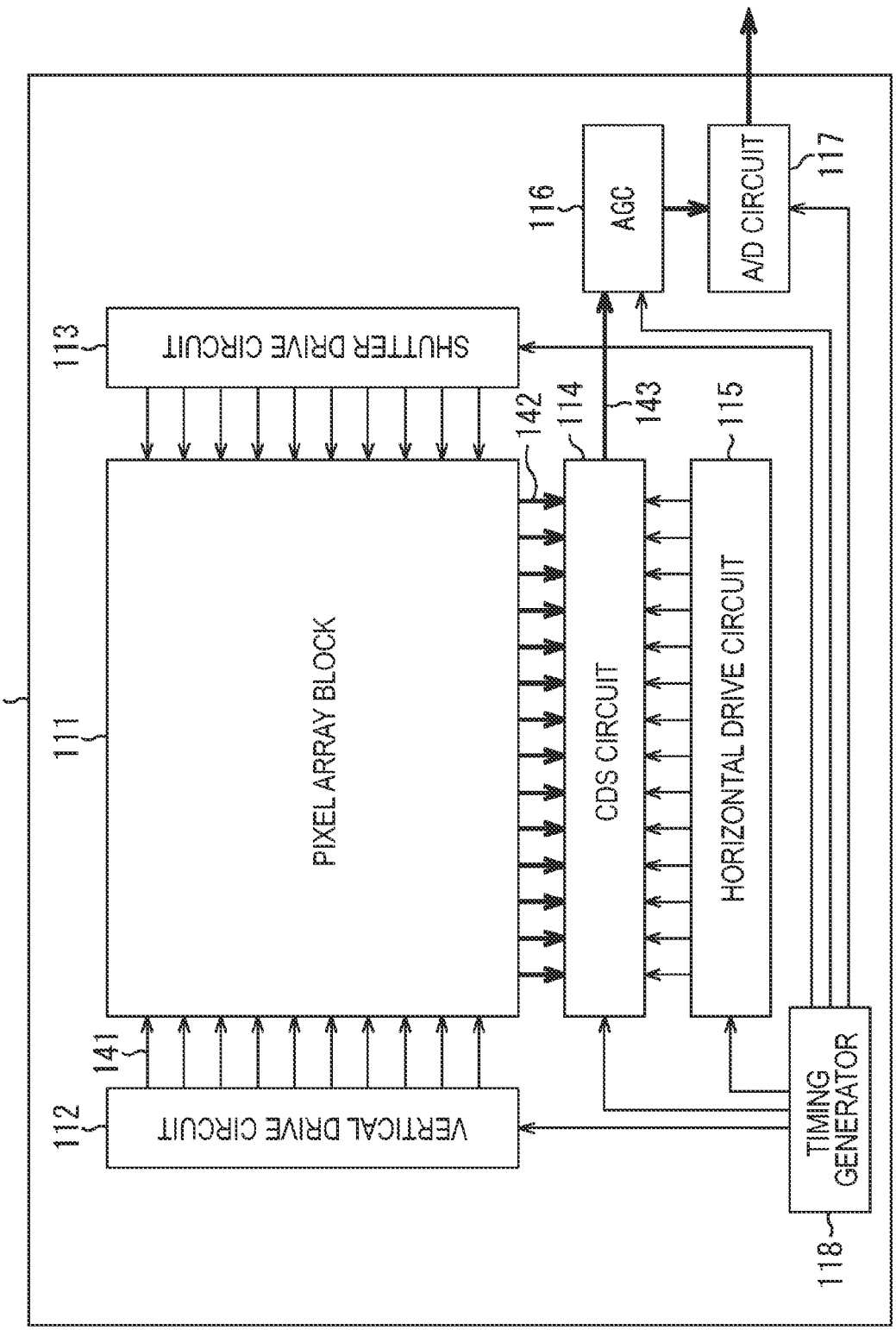
FIG. 2 is a diagram illustrating a configuration example of a CMOS image sensor to which the present technology is applied.

A CMOS image sensor 100 of FIG. 2 includes a pixel array block 111, a vertical drive circuit 112, a shutter drive circuit 113, a CDS circuit 114, a horizontal drive circuit 115, an AGC 116, an A/D circuit 117, and a timing generator 118.

In the pixel array block 111, a plurality of pixels are two-dimensionally arrayed, each of the pixels including a photoelectric conversion device and a plurality of transistors. In addition, a plurality of signal wirings for driving the respective pixels and the output signal lines from the respective pixels are connected to the pixel array block 111.

The vertical drive circuit 112 supplies a signal for selecting a reading row from the pixel, to the pixel array block 111 via a row control line 141.

The shutter drive circuit 113 performs row selection of the pixels similarly to the vertical drive circuit 112, and is capable of adjusting exposure time (accumulation time) to the photoelectric conversion device by adjusting an interval to the vertical drive circuit 112. A signal read from the row selected by the vertical drive circuit 112 is input to the CDS circuit 114 arranged for each one column or a plurality of columns via the pixel output line 142 provided for each column.

The Correlated Double Sampling (CDS) circuit 114 receives a reset level and a signal level from each of the pixels via the pixel output line 142, and removes fixed pattern noise for each of the pixels by performing subtraction between the reset level and the signal level.

The horizontal drive circuit 115 sequentially selects a signal to which CDS processing is performed and that is stored in each column; the signal of the column selected is passed to the Auto Gain Controller (AGC) 116 of the subsequent stage via a horizontal signal line 143, and is multiplied by an appropriate gain, and then is converted into a digital signal from an analog signal by the Analog/Digital (A/D) circuit 117. The signal obtained in this way is output to the outside of the CMOS image sensor 100.

Incidentally, each block, such as the vertical drive circuit 112, the shutter drive circuit 113, the CDS circuit 114, horizontal drive circuit 115, the AGC 116, and the A/D circuit 117, is driven by a signal generated inside the timing generator 118.

The above configuration of the CMOS image sensor 100 is an example of the CMOS image sensors, and other configurations can be adopted, such as a configuration of including the A/D circuit in the outside or in each column, and a configuration of including the only one CDS circuit.

Figure 3:
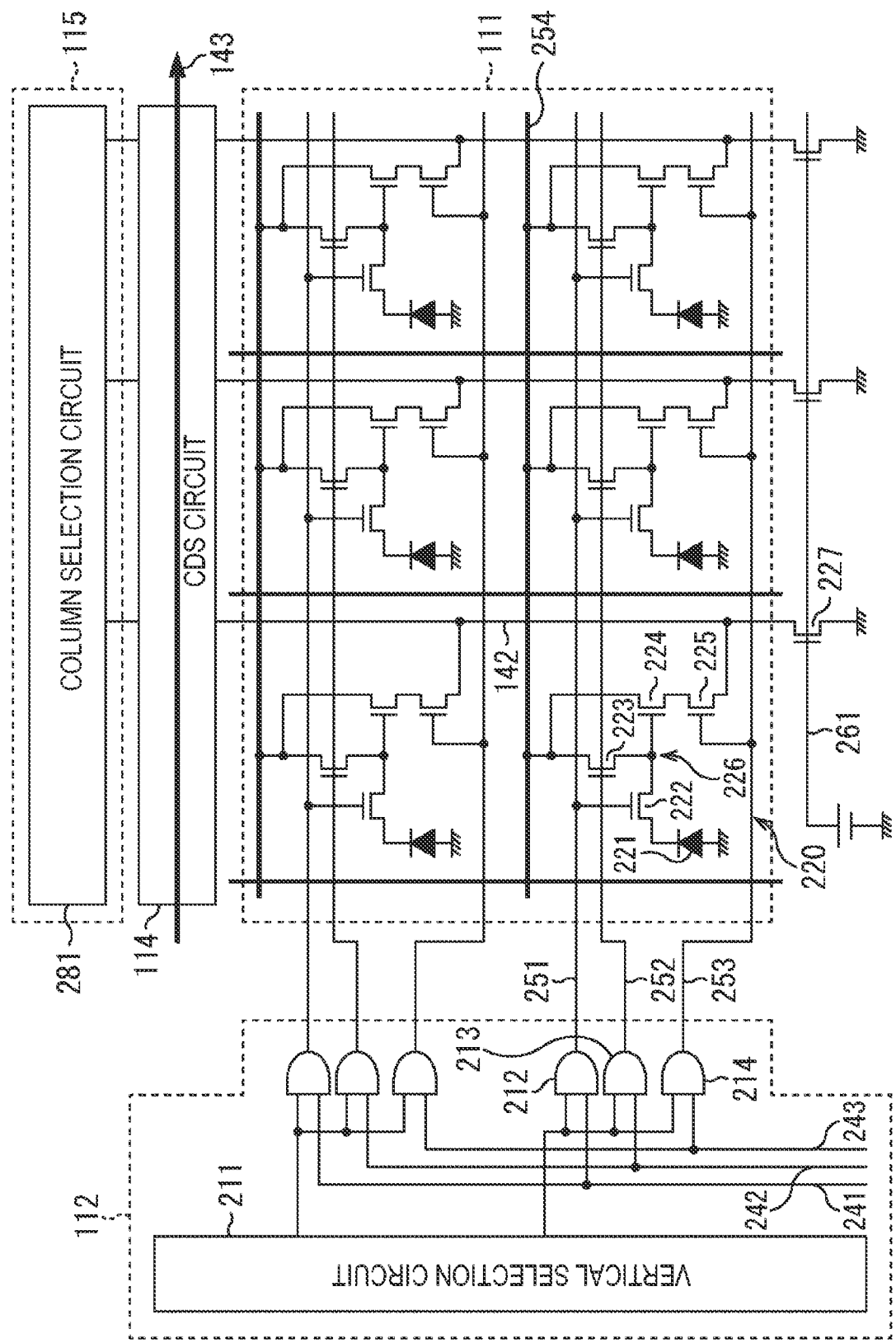
FIG. 3 is a diagram illustrating a detailed configuration example of pixels and peripheral circuits.

(Configuration Example of Pixels and Peripheral Circuits)
FIG. 3 is a diagram illustrating a detailed configuration example of pixels and peripheral circuits in the CMOS image sensor 100 of FIG. 2.

As illustrated in FIG. 3, each of pixels 220 includes as active devices four transistors of a transfer transistor 222, a reset transistor 223, an amplifying transistor 224, and a selection transistor 225, for one photoelectric conversion device 221.

The photoelectric conversion device 221 is a photodiode for photoelectrically converting incident light into a charge of an amount depending on an amount of light of the incident light. The transfer transistor 222 transfers a signal charge photoelectrically converted by the photoelectric conversion device 221 to a gate electrode of the amplifying transistor 224 via floating diffusion 226. The gate of the transfer transistor 222 is connected to a transfer signal wiring 251 for controlling a gate potential of the transfer transistor 222.

The reset transistor 223 resets the gate electrode of the amplifying transistor 224. The gate of the reset transistor 223 is connected to a reset signal wiring 252 for controlling a gate potential of the reset transistor 223. Incidentally, the drain of the reset transistor 223 and the drain of the amplifying transistor 224 are both connected to a power supply potential supply line 254.

The selection transistor 225 is connected to the pixel output line 142, and selects an output pixel. The gate of the selection transistor 225 is connected to a selection signal wiring 253 for controlling a gate potential of the selection transistor 225.

A transistor 227 is a transistor for supplying a constant current to the pixel output line 142, and supplies the constant current to the amplifying transistor 224 of the pixel selected to make the amplifying transistor 224 operate as a source follower, and a potential having a certain constant voltage difference from a gate potential of the amplifying transistor 224 appears in the pixel output line 142. Incidentally, a constant potential supply line 261 supplies a constant potential to the gate of the transistor 227 so that the transistor 227 performs saturation region operation for supplying a certain constant current.

The vertical drive circuit 112 includes a vertical selection circuit 211, and a row selection AND device 212, a row selection AND device 213, and a row selection AND device 214 provided for each row.

A signal terminal 241 for supplying a transfer signal TRG to the transfer signal wiring 251 of each row is connected to one input port of the row selection AND device 212, and an output from the vertical selection circuit 211 is connected to the other input port. In addition, the output port of the row selection AND device 212 is connected to the transfer signal wiring 251.

A signal terminal 242 for supplying a reset signal RST to the reset signal wiring 252 of each row is connected to one input port of the row selection AND device 213, and the output from the vertical selection circuit 211 is connected to the other input port. In addition, the output port of the row selection AND device 213 is connected to the reset signal wiring 252.

A signal terminal 243 for supplying a selection signal SEL to the selection signal wiring 253 of each row is connected to one input port of the row selection AND device 214, and the output from the vertical selection circuit 211 is connected to the other input port. In addition, the output port of the row selection AND device 214 is connected to the selection signal wiring 253.

Since each of the pixels two-dimensionally arrayed in the pixel array block 111 and peripheral circuits thereof have such a configuration, each drive signal is supplied only to each signal wiring of the row selected by the vertical selection circuit 211. Reading operation from each of the pixels is performed as illustrated in a timing chart of FIG. 4.

Figure 4:
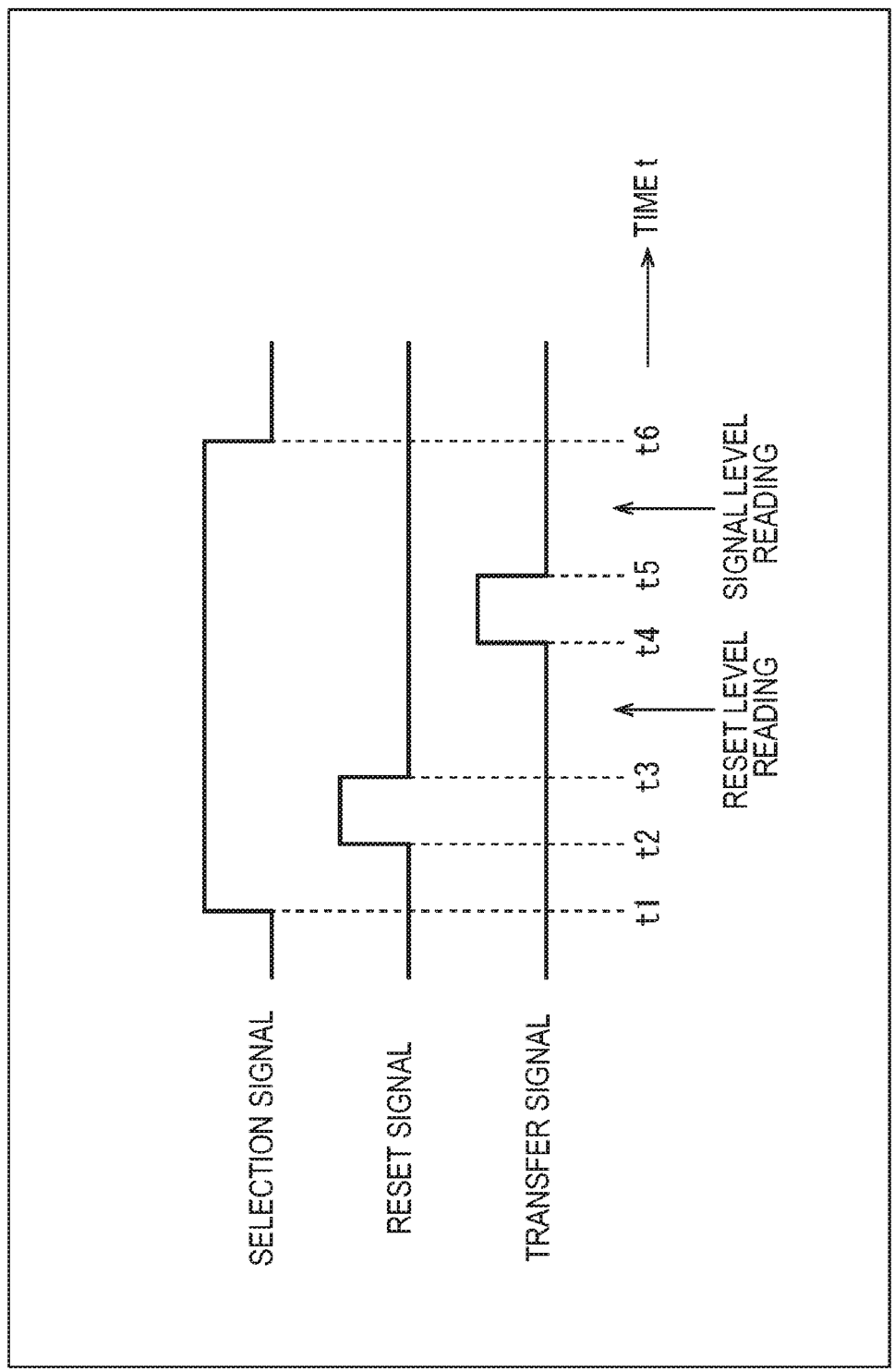
FIG. 4 is a timing chart describing reading operation from each of the pixels.

FIG. 4 is a timing chart describing reading operation from each of the pixels. Incidentally, in the timing chart of FIG. 4, a direction of time is a direction from the left side to the right side in the figure. In addition, the selection signal SEL is a pulse drive signal input to the gate of the selection transistor 225 via the selection signal wiring 253. The reset signal RST is a pulse drive signal input to the gate of the reset transistor 223 via the reset signal wiring 252. The transfer signal TRG is a pulse drive signal input to the transfer transistor 222 via the transfer signal wiring 251.

As illustrated in FIG. 4, during from time t1 to t6, the selection signal SEL becomes the H level, and the selection transistor 225 is turned on. In addition, at time t2, the reset signal RST becomes the H level, and the reset transistor 223 is turned on. Thus, the gate electrode of the amplifying transistor 224 is reset. After that, at time t3, the reset signal RST is made to become the L level and the reset transistor 223 is turned off, and then a voltage corresponding to the reset level of each of the pixels is read to the CDS circuit 114 of the subsequent stage.

Next, at time t4, the transfer signal TRG is made to become the H level and the transfer transistor 222 is turned on, and the charge accumulated in the photoelectric conversion device 221 is transferred to the gate electrode of the amplifying transistor 224. At time t5, when transfer of the charge is completed, the transfer signal TRG is made to become the L level and the transfer transistor 222 is turned off, and then a voltage of a signal level depending on the amount of charge accumulated is read to the CDS circuit 114 of the subsequent stage.

In the CDS circuit 114, subtraction is performed between the reset level previously read and the signal level, and fixed pattern noise is canceled generated by variations in Vth of the reading transistor for each of the pixels. The signal accumulated in the CDS circuit 114, when selected by a column selection circuit 281, is read by the circuit of the subsequent stage such as the AGC 116 via the horizontal signal line 143 and processed.

(Pixel Structure in which a Plurality of Pixel Output Lines are Provided Per One Column)

Figure 5:
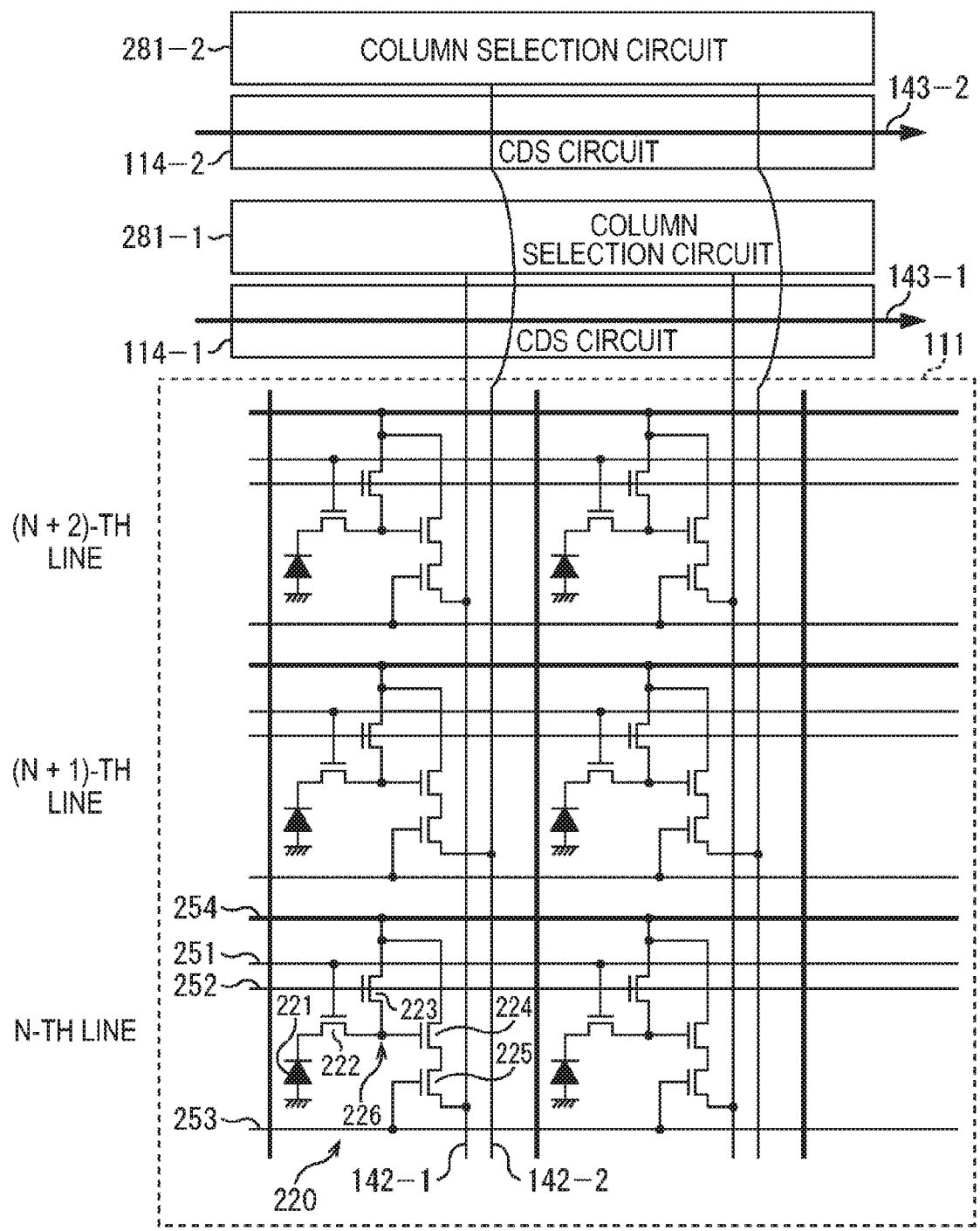
FIG. 5 is a diagram illustrating pixel structure in which two pixel output lines are provided per one column.

FIG. 5 is a diagram illustrating pixel structure in which two pixel output lines are provided per one column.

In the pixel structure of FIG. 5, two pixel output lines 142-1 and 142-2 are provided for each column. The selection transistor 225 of each of the pixels 220 provided in N-th line, (N+2)-th line, (N+4)-th line, . . . is connected to the pixel output line 142-1. On the other hand, the selection transistor 225 of each of the pixels 220 provided in (N+1)-th line, (N+3)-th line, (N+5)-th line, . . . is connected to the pixel output line 142-2.

The pixel output line 142-1 is connected to a CDS circuit 114-1 and is driven by a column selection circuit 281-1, and reading is performed through a horizontal signal line 143-1. On the other hand, the pixel output line 142-2 is connected to a CDS circuit 114-2 and is driven by a column selection circuit 281-2, and reading is performed through a horizontal signal line 143-2.

In this way, by performing reading from two rows at the same time in parallel with the configuration in which reading route is separated, reading speed of the pixel signal can be increased.

Figure 6:
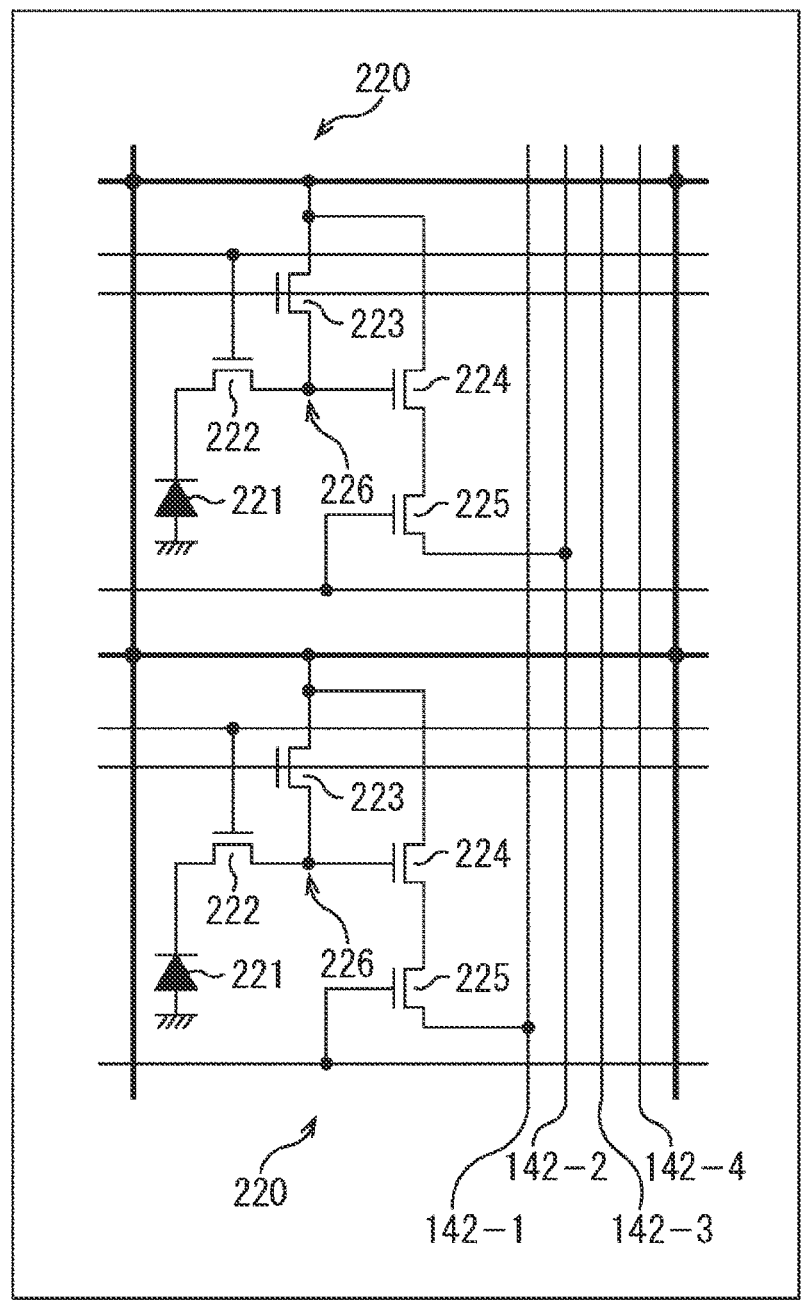
FIG. 6 is a diagram illustrating pixel structure in which four pixel output lines are provided per one column.

In addition, as illustrated in FIG. 6, four pixel output lines 142-1 to 142-4 can be provided for each column. In pixel structure of FIG. 6, for example, the selection transistor 225 of each of the pixels 220 provided in N-th line, (N+4)-th line, . . . is connected to the pixel output line 142-1, and the selection transistor 225 of each of the pixels 220 provided in (N+1)-th line, (N+5)-th line, . . . is connected to the pixel output line 142-2.

Further, in pixel structure of FIG. 6, the selection transistor 225 of each of the pixels 220 provided in (N+2)-th line, (N+6)-th line, . . . is connected to the pixel output line 142-3, and the selection transistor 225 of each of the pixels 220 provided in (N+3)-th line, (N+7)-th line, . . . is connected to the pixel output line 142-4, and the pixel output lines are respectively connected to different CDS circuits 114, and further, respectively driven by the different column selection circuits 281. Thus, reading from four rows is performed at the same time in parallel, and reading speed of the pixel signal can be further increased.

<3. Wiring Structure of Pixel>

Meanwhile, as described above, by providing a plurality of pixel output lines 142 per one column, an increase in reading speed of the pixel signal can be achieved, for example, the pixel signal can be read at double speed in a case in which two pixel output lines 142 are provided; however, since wiring density is increased, various influences occur, such as an increase in the parasitic capacitance, and the lateral stripes on the screen. Accordingly, in the present technology, by separating the wiring layer in which the plurality of pixel output lines 142 are arranged, a distance between the pixel output lines and a distance from other nodes are increased to reduce the parasitic capacitance, and influence can be avoided that is unique in the solid state imaging device such as the lateral stripes on the screen due to a slight capacitance difference of each of the nodes.

Hereinafter, wiring structure of a pixel in which the plurality of pixel output lines 142 are arranged separately in a plurality of wiring layers is described with a first embodiment to an eighth embodiment.

(1) First Embodiment

Figure 7:
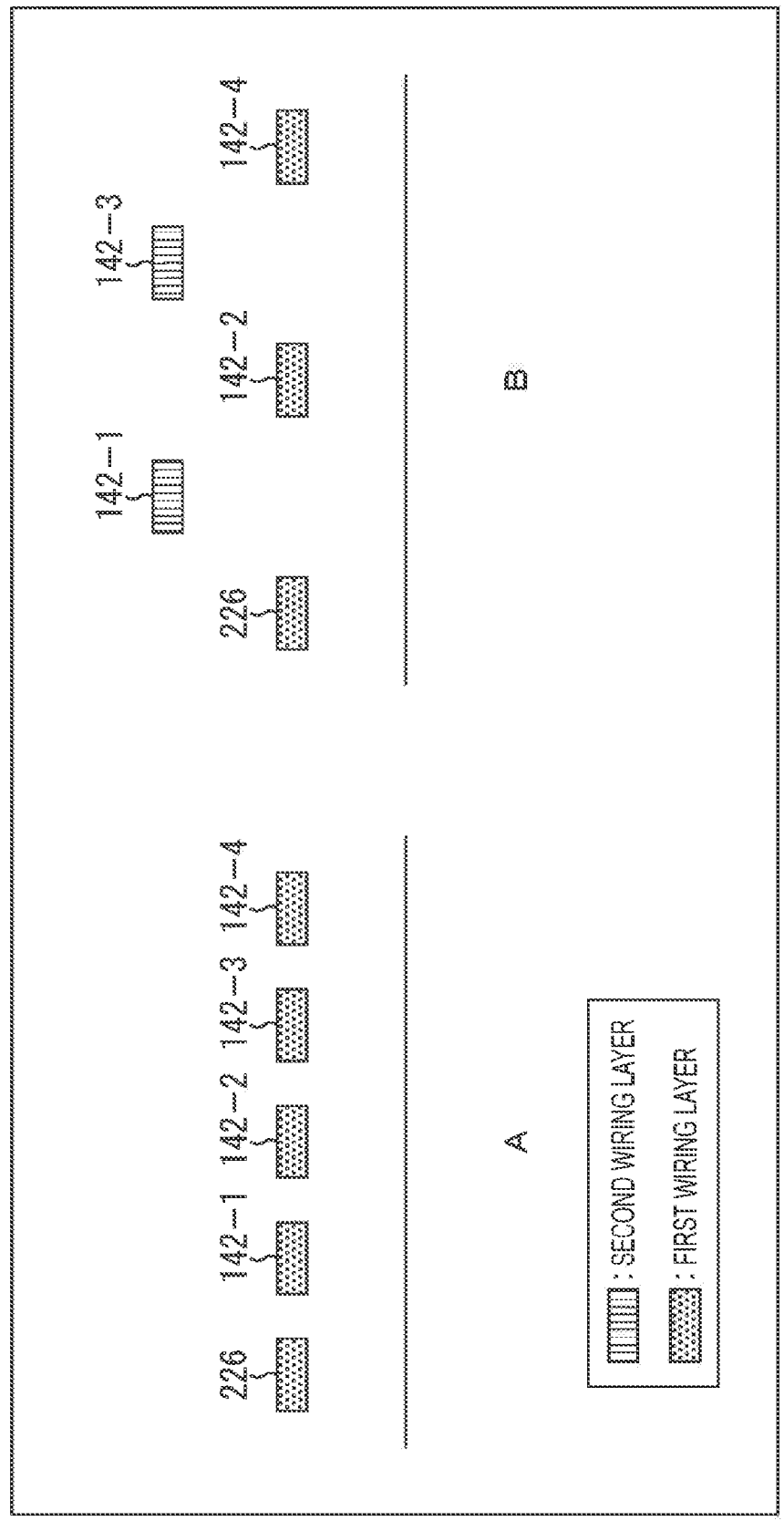
FIG. 7 is a cross-sectional view illustrating wiring structure of the pixel of a first embodiment.

FIG. 7 is a cross-sectional view illustrating wiring structure of a pixel of the first embodiment. Incidentally, in the cross-sectional view of FIG. 7, wiring of the floating diffusion 226 (hereinafter, referred to as "FD wiring 226") is illustrated in the left side of four pixel output lines 142-1 to 142-4 arranged in parallel; however, other wirings are omitted to simplify the description. It is similar in other figures described later that the wirings other than the FD wiring 226 are omitted.

In A of FIG. 7, wiring structure is illustrated for comparison, in which all of four pixel output lines 142-1 to 142-4 are arranged in one wiring layer (first wiring layer). In a case in which the wiring structure of A of FIG. 7 is adopted, as previously described, due to narrowing of the interval between the FD wiring 226 and the pixel output line 142-1 or the interval between the pixel output lines 142-1 to 142-4, the parasitic capacitance of the wiring is increased and RC delay becomes larger, or the problem of coupling between the wirings occurs.

Accordingly, in the present technology, as illustrated in B of FIG. 7, the pixel output lines 142-1 to 142-4 are arranged separately in a plurality of wiring layers (first wiring layer, second wiring layer). That is, in wiring structure of B of FIG. 7, in a case in which four pixel output lines 142 are arranged in parallel in the right side of the FD wiring 226, the pixel output line 142-2 and the pixel output line 142-4 of the four pixel output lines 142 are arranged in the first wiring layer, and the pixel output line 142-1 and the pixel output line 142-3 are arranged in the second wiring layer.

By adopting the wiring structure of B of FIG. 7, the pixel output lines 142-1 to 142-4 are arranged alternately in the first wiring layer and the second wiring layer, and distances between the pixel output lines 142 are increased, so that the parasitic capacitance can be suppressed. In addition, in the wiring structure of B of FIG. 7, the pixel output line 142-1 arranged in the closest position to the FD wiring 226 is arranged in the second wiring layer different from the first wiring layer in which the FD wiring 226 is arranged, so that coupling capacitance can be suppressed. Thus, it can be suppressed that a difference occurs between the signal outputs for each of the pixels due to the fact that only the coupling capacitance between the pixel output line 142-1 and the floating diffusion 226 is increased, to the coupling capacitance between the pixel output lines 142-2 to 142-4 and the floating diffusion 226.

Incidentally, in the wiring structure of B of FIG. 7, an example is illustrated in which the FD wiring 226, the pixel output line 142-2, and the pixel output line 142-4 are arranged in the same first wiring layer; however, the FD wiring 226, and the pixel output line 142-2, 142-4 can be arranged in different wiring layers, and, for example, the pixel output line 142-2 and the pixel output line 142-4 can be arranged in a third wiring layer (not illustrated).

As described above, in the first embodiment, in the pixel structure in which a plurality of pixel output lines 142 are provided per one column, the plurality of pixel output lines 142 are arranged separately in the plurality of wiring layers, and the pixel output line 142-1 arranged in the closest position to the FD wiring 226 is arranged in a different wiring layer from the wiring layer of the FD wiring 226, so that the influence caused by the increase in wiring density can be avoided.

(2) Second Embodiment

Figure 8:
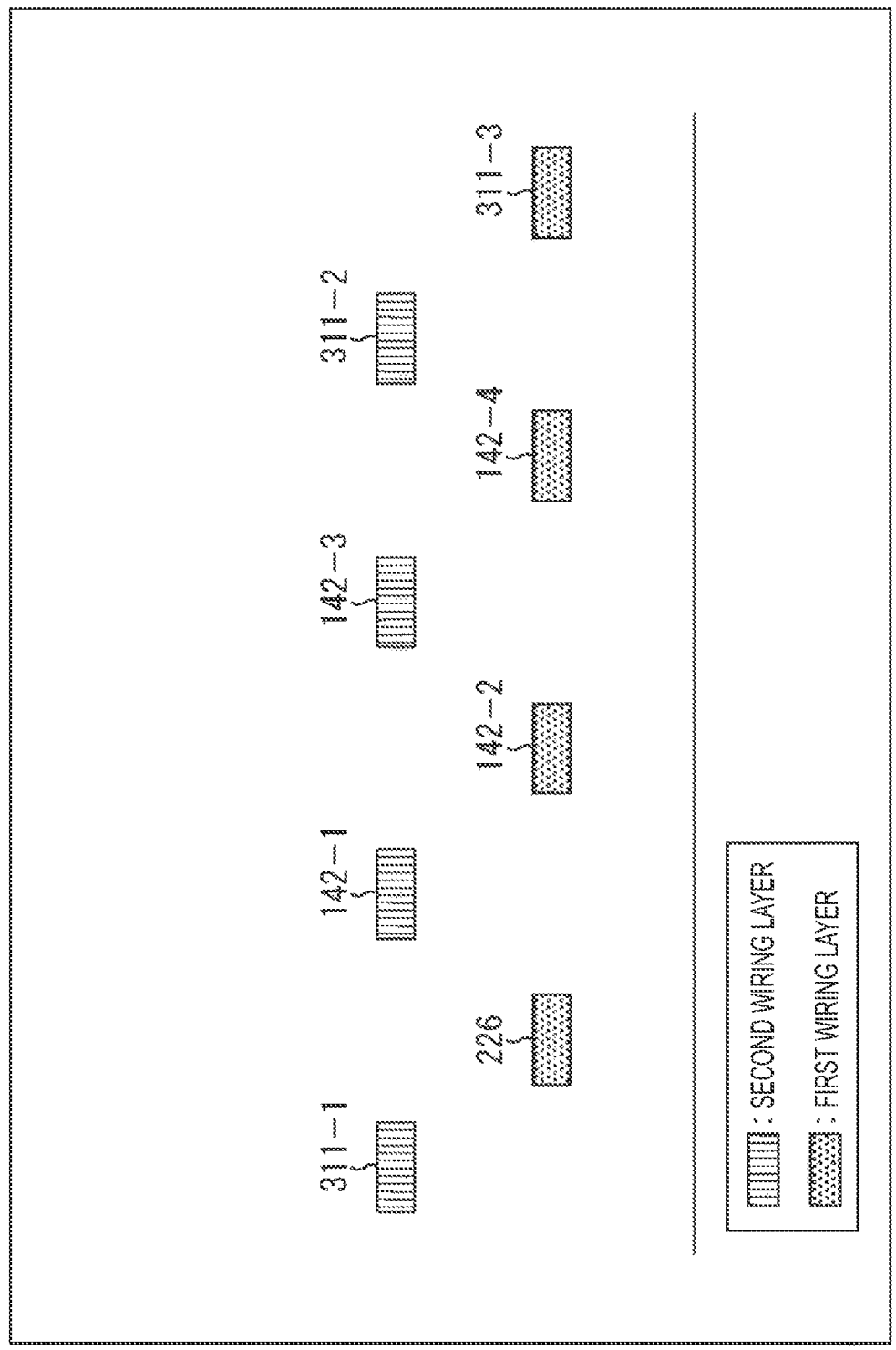
FIG. 8 is a cross-sectional view illustrating wiring structure of a pixel of a second embodiment.

FIG. 8 is a cross-sectional view illustrating wiring structure of a pixel of the second embodiment.

In the wiring structure of FIG. 8, similarly to the wiring structure of B of FIG. 7, the pixel output line 142-2 and the pixel output line 142-4 of the plurality of pixel output lines 142 are arranged in the first wiring layer, and the pixel output line 142-1 and the pixel output line 142-3 are arranged in the second wiring layer. In addition, the FD wiring 226 is arranged in the first wiring layer.

In addition, in the wiring structure of FIG. 8, dummy wirings 311-1 to 311-3 are arranged for four pixel output lines 142. That is, the dummy wirings 311-1 to 311-3 are arranged in the periphery of the pixel output lines 142-1 to 142-4 respectively arranged in different wiring layers, to make load capacitance of the pixel output lines 142 uniform.

For example, the dummy wiring 311-1 is arranged in the left side of the pixel output line 142-1, and the dummy wiring 311-2 is arranged in the right side of the pixel output line 142-3, and the dummy wiring 311-3 is arranged in the right side of the pixel output line 142-4, to make load capacitance uniform between the pixel output line 142 sandwiched by the other pixel output lines 142 and the pixel output lines 142 arranged in both ends. Incidentally, other than the wiring of floating, for example, wirings for the power supply, ground, and drive signal can be used for the dummy wirings 311.

As described above, in the second embodiment, in the pixel structure in which the plurality of pixel output lines 142 are provided per one column, the plurality of pixel output lines 142 are arranged separately in a plurality of wiring layers, and further, the dummy wirings 311 are arranged in the periphery of the plurality of pixel output lines 142, to make load capacitance of the pixel output lines 142 uniform, so that the influence caused by the increase in wiring density can be avoided. In addition, in the second embodiment, the FD wiring 226 and the pixel output line 142-1 arranged in the closest position to the FD wiring 226 can be respectively arranged in different wiring layers.

(3) Third Embodiment

Figure 9:
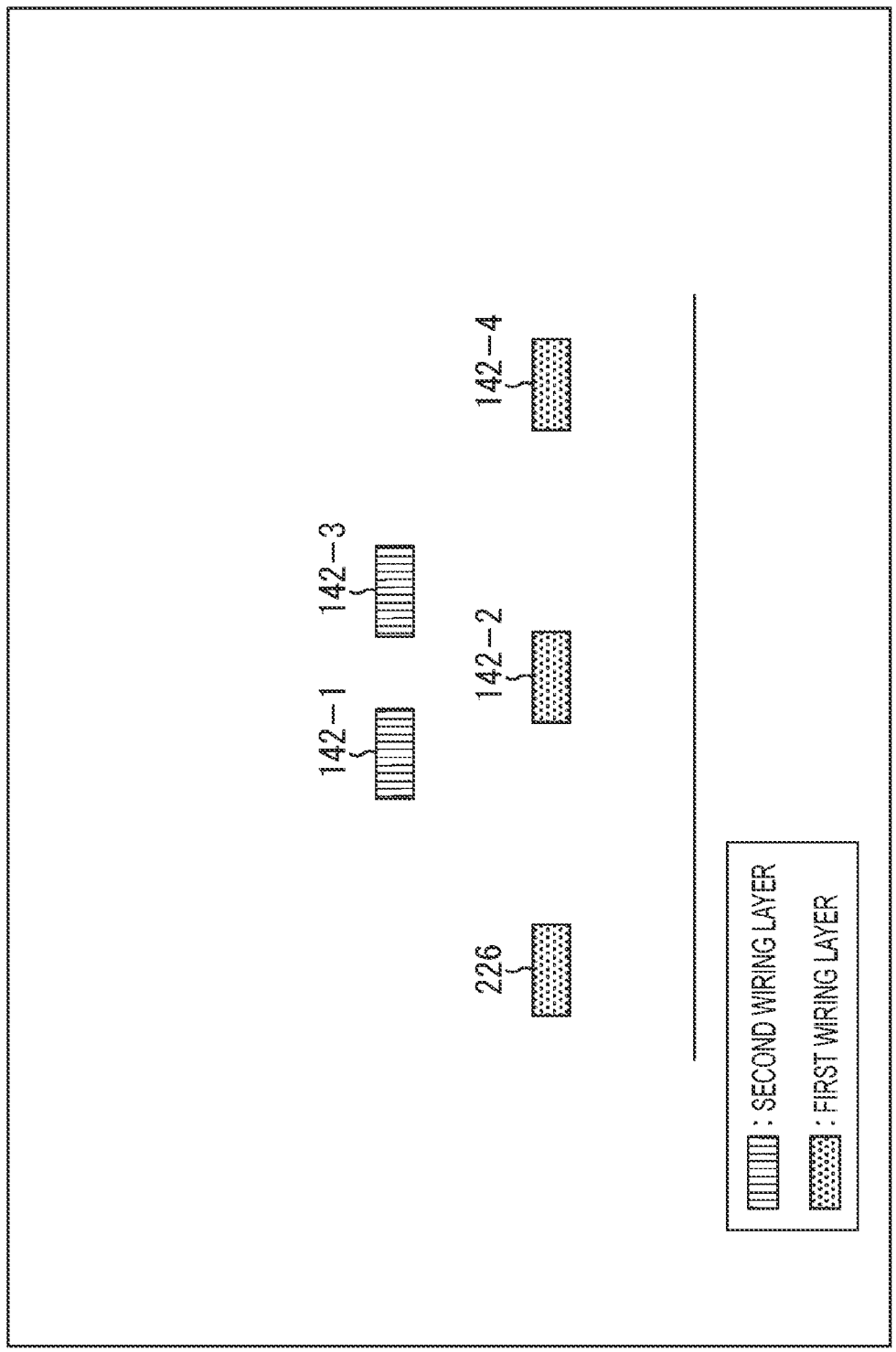
FIG. 9 is a cross-sectional view illustrating wiring structure of a pixel of a third embodiment.

FIG. 9 is a cross-sectional view illustrating wiring structure of a pixel of the third embodiment.

In the wiring structure of FIG. 9, similarly to the wiring structure of B of FIG. 7, the pixel output line 142-2 and the pixel output line 142-4 of the plurality of pixel output lines 142 are arranged in the first wiring layer, and the pixel output line 142-1 and the pixel output line 142-3 are arranged in the second wiring layer. In addition, the FD wiring 226 is arranged in the first wiring layer.

However, in the wiring structure of FIG. 9, the interval between the pixel output line 142-1 and the pixel output line 142-3 arranged in the second wiring layer is narrower than the interval between the pixel output line 142-2 and the pixel output line 142-4 arranged in the first wiring layer. That is, it has been known that, in the first wiring layer being a lower layer of the second wiring layer, layout of feeder lines to be used for taking out the power supply and the like often becomes tight and the parasitic capacitance is increased, and the interval is made to be narrower between the pixel output line 142-1 and the pixel output line 142-3 arranged in the second wiring layer being an upper layer, to make the total parasitic capacitance of those contributing to the pixel output lines 142 uniform with the parasitic capacitance in the first wiring layer being the lower layer.

As described above, in the third embodiment, in the pixel structure in which the plurality of pixel output lines 142 are provided per one column, the plurality of pixel output lines 142 are arranged separately in a plurality of wiring layers, and further, the interval is made to be narrower between the pixel output line 142-1 and the pixel output line 142-3 arranged in the upper wiring layer (second wiring layer), to make the parasitic capacitance uniform with that of the lower wiring layer (first wiring layer), so that the influence caused by the increase in wiring density can be avoided. In addition, in the third embodiment, the FD wiring 226 and the pixel output line 142-1 arranged in the closest position to the FD wiring 226 can be respectively arranged in different wiring layers.

(4) Fourth Embodiment

Figure 10:
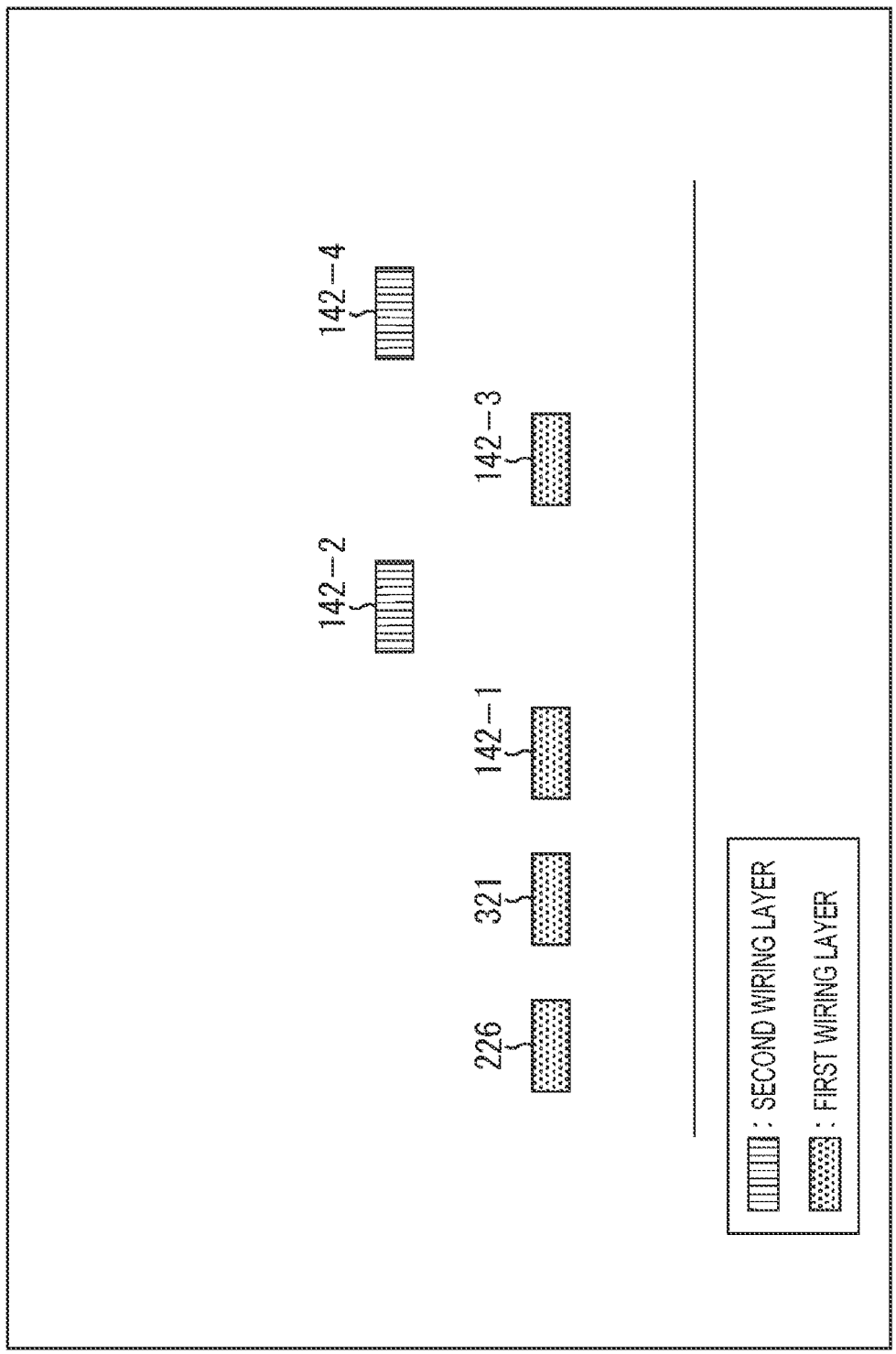
FIG. 10 is a cross-sectional view illustrating wiring structure of a pixel of a fourth embodiment.

FIG. 10 is a cross-sectional view illustrating wiring structure of a pixel of the fourth embodiment.

In the wiring structure of FIG. 10, similarly to the wiring structure of B of FIG. 7, the plurality of pixel output lines 142 are arranged separately in a plurality of wiring layers; however, the FD wiring 226 and the pixel output line 142 arranged in the closest position to the FD wiring 226 are arranged in the same wiring layer. That is, for the FD wiring 226 arranged in the first wiring layer, the pixel output line 142-1 and the pixel output line 142-3 are arranged in the first wiring layer, and the pixel output line 142-2 and the pixel output line 142-4 are arranged in the second wiring layer.

In addition, in the wiring structure of FIG. 10, in the first wiring layer, a shield wiring 321 is arranged between the FD wiring 226 and the pixel output line 142-1. That is, by arranging the shield wiring 321 between the FD wiring 226 and the pixel output line 142-1, coupling can be reduced between the floating diffusion 226 and the pixel output line 142-1.

As described above, in the fourth embodiment, in the pixel structure in which a plurality of pixel output lines 142 are provided per one column, the plurality of pixel output lines 142 are arranged separately in the plurality of wiring layers, and the FD wiring 226 and the pixel output line 142-1 arranged in the closest position to the FD wiring 226 are arranged in the same wiring layer, and further, the shield wiring 321 is arranged between the FD wiring 226 and the pixel output line 142-1 to reduce coupling of those wirings, so that the influence caused by the increase in wiring density can be avoided.

(5) Fifth Embodiment

Figure 11:
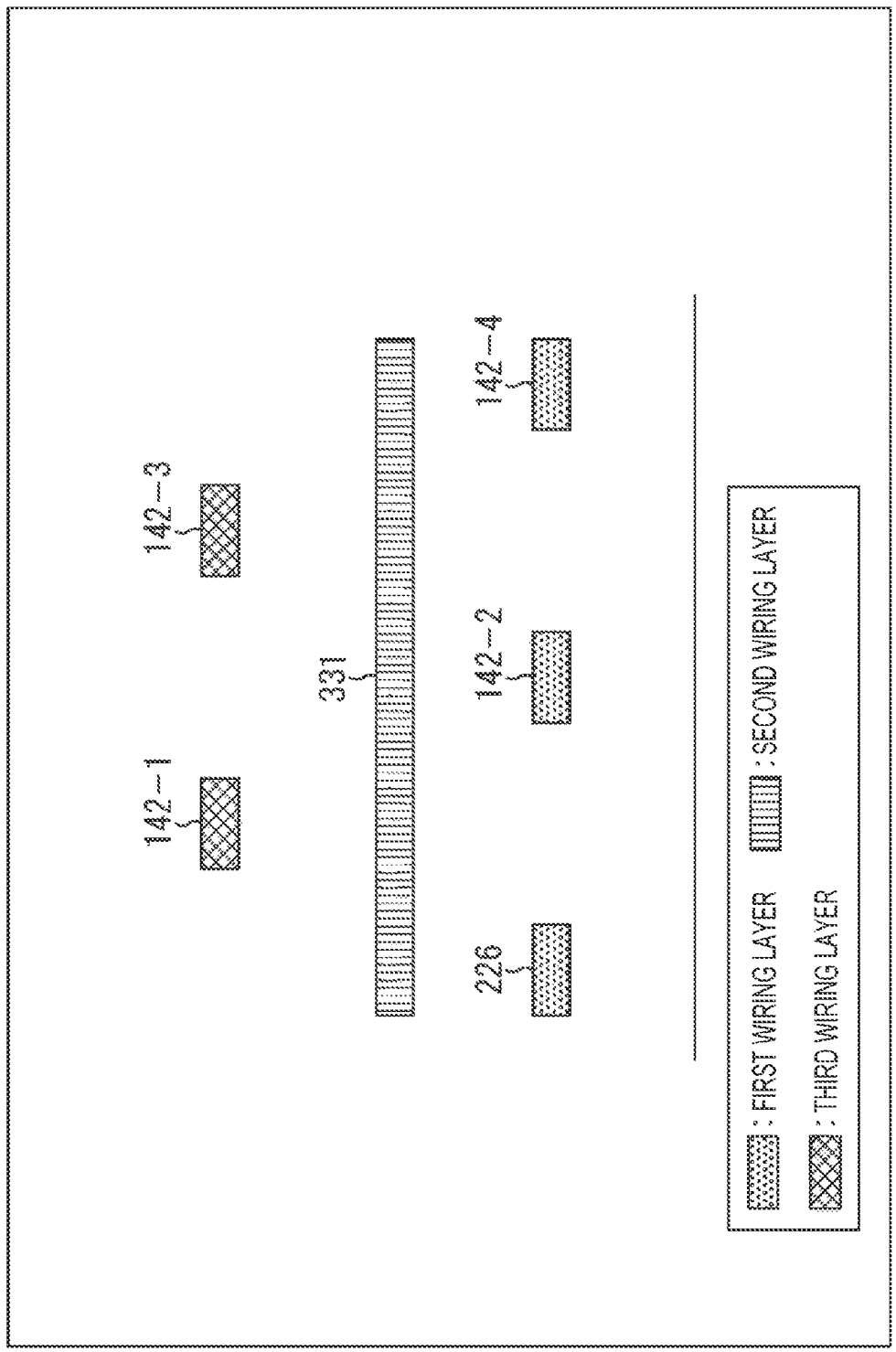
FIG. 11 is a cross-sectional view illustrating wiring structure of a pixel of a fifth embodiment.

FIG. 11 is a cross-sectional view illustrating wiring structure of a pixel of the fifth embodiment.

In the wiring structure of FIG. 11, similarly to the wiring structure of B of FIG. 7, the plurality of pixel output lines 142 are arranged separately in a plurality of wiring layers; however, between the first wiring layer in which the FD wiring 226, the pixel output line 142-2, and the pixel output line 142-4 are arranged and the third wiring layer in which the pixel output line 142-1 and the pixel output line 142-3 are arranged, the other wiring layer (second wiring layer) is provided.

That is, the pixel output line 142-1 and the pixel output line 142-3 are not arranged in the second wiring layer being the upper layer of the first wiring layer in which the FD wiring 226, the pixel output line 142-2, and the pixel output line 142-4 are arranged, and is arranged in the third layer being a further upper layer. Thus, in the wiring structure of FIG. 11, by the other wiring layer (second wiring layer), coupling between the pixel output line 142-1, pixel output line 142-3 and the pixel output line 142-2, pixel output line 142-4, and coupling between the pixel output line 142-1, pixel output line 142-3 and the floating diffusion 226 can be suppressed physically.

In addition, in the wiring structure of FIG. 11, a shield wiring 331 can be arranged in the other wiring layer (second wiring layer).

As described above, in the fifth embodiment, in the pixel structure in which the plurality of pixel output lines 142 are provided per one column, the plurality of pixel output lines 142 are arranged separately in the plurality of wiring layers (first wiring layer, second wiring layer), and further, between the lower wiring layer (first wiring layer) and the upper wiring layer (third wiring layer), the other wiring layer (second wiring layer) is provided, so that the influence caused by the increase in wiring density can be avoided. In addition, in the fifth embodiment, the FD wiring 226 and the pixel output line 142-1 arranged in the closest position to the FD wiring 226 can be respectively arranged in different wiring layers.

(6) Sixth Embodiment

Figure 12:
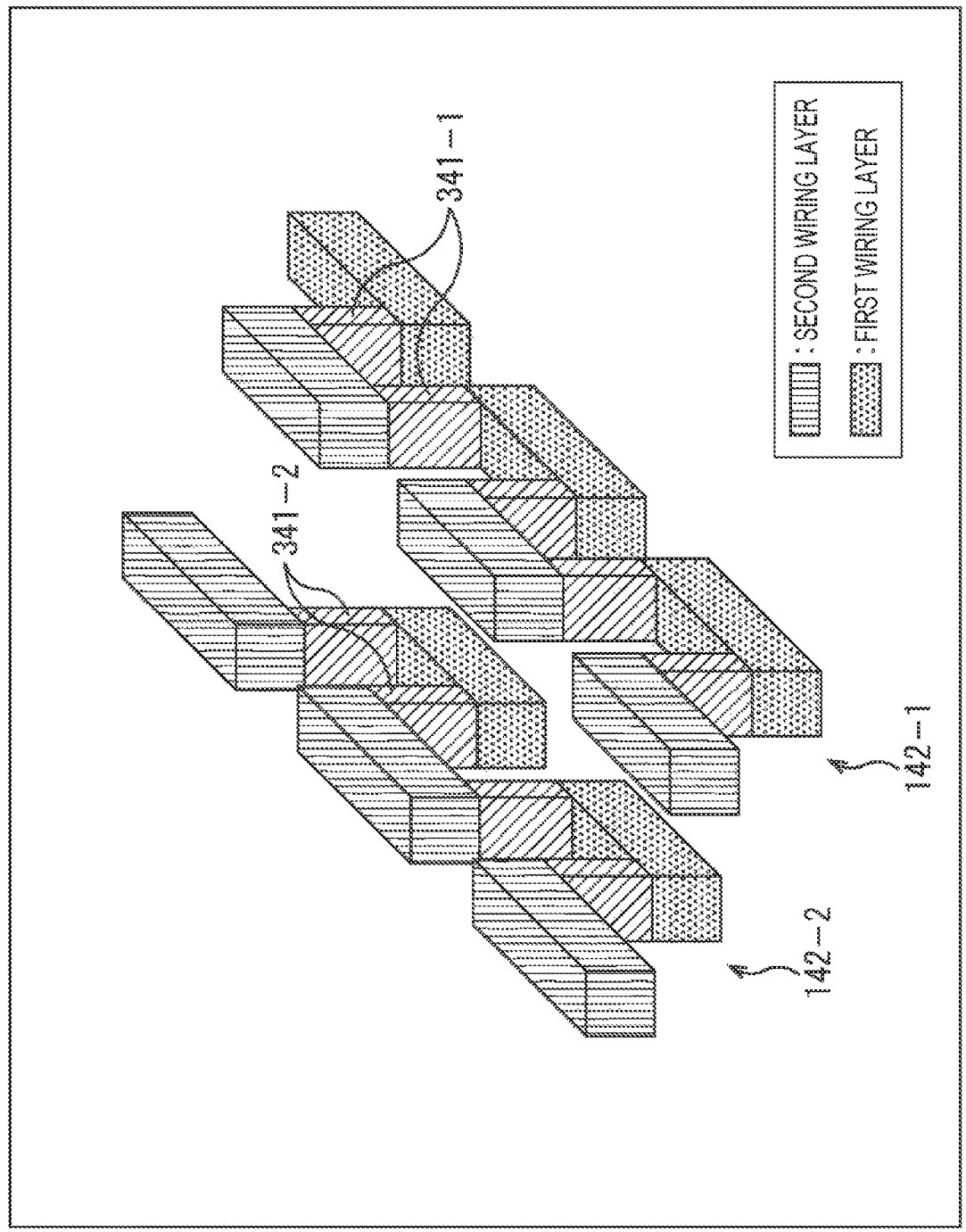
FIG. 12 is a perspective view illustrating wiring structure of a pixel of a sixth embodiment.

FIG. 12 is a perspective view illustrating wiring structure of a pixel of the sixth embodiment.

In the wiring structure of FIG. 12, in contrast with the wiring structure of B of FIG. 7 in which one pixel output line 142 is wired in a single layer by using each of different wiring layers, wiring is performed while alternately switching two wiring layers of the first wiring layer and the second wiring layer at a constant interval via contacts 341. Further, such switching between the first wiring layer and the second wiring layer is performed by the pixel output lines 142 adjacent to each other in a reversed cycle to each other.

Specifically, in the wiring structure of FIG. 12, an example is illustrated of a switching cycle between the pixel output line 142-1 and the pixel output line 142-2; when one pixel output line 142-1 is in the first wiring layer, the other pixel output line 142-2 is in the second wiring layer. In addition, when one pixel output line 142-1 is in the second wiring layer via a contact 341-1, the other pixel output line 142-2 is in the first wiring layer via a contact 341-2.

With this wiring structure of FIG. 12, the wiring layers of the pixel output lines 142 adjacent to each other are prevented from being similar as much as possible, so that the parasitic capacitance can be suppressed between the pixel output lines 142, similarly to the wiring structure of B of FIG. 7. In addition, in contrast with the wiring structure of B of FIG. 7 in which a characteristic difference may occur between the pixel output lines 142 since one pixel output line 142 is drawn in a single layer by using each of different wiring layers, the characteristic difference due to a difference between layers can be suppressed in the wiring structure of FIG. 12.

Incidentally, as for the cycle for alternately switching the pixel output line 142 between different wiring layers via the contact 341, for example, an optimal cycle can be adopted depending on layout and a sharing unit of the pixel such as one-pixel unit, two-pixel unit, or four-pixel unit.

As described above, in the sixth embodiment, in the pixel structure in which the plurality of pixel output lines 142 are provided per one column, when the plurality of pixel output lines 142 are arranged separately in a plurality of wiring layers, the wiring layers in which the pixel output lines are arranged are alternately switched at the constant interval via the contact 341 for each of the pixel output lines 142, so that the influence caused by the increase in wiring density can be avoided.

(7) Seventh Embodiment

Figure 13:
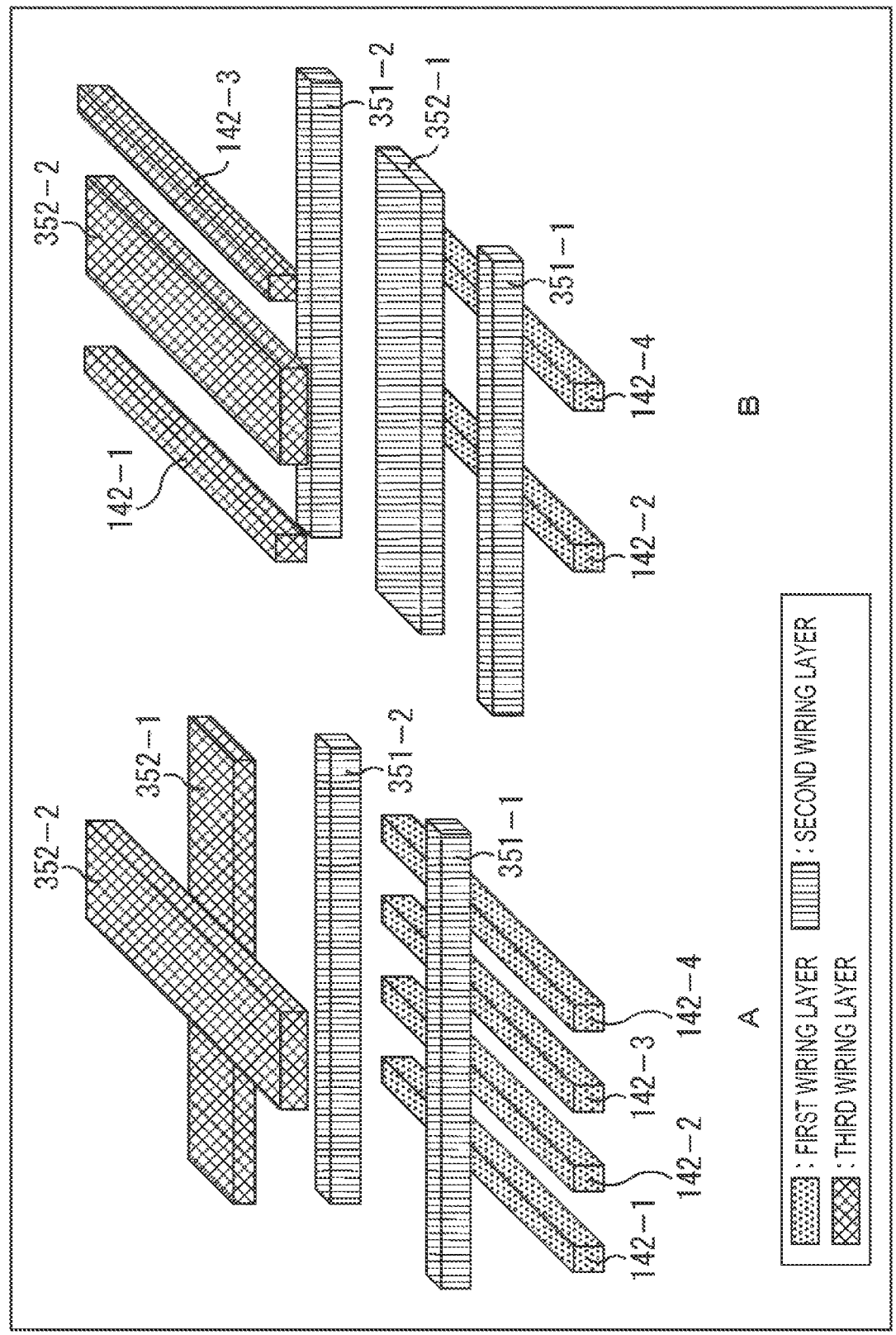
FIG. 13 is a perspective view illustrating wiring structure of a pixel of a seventh embodiment.

FIG. 13 is a perspective view illustrating wiring structure of a pixel of the seventh embodiment.

In the wiring structure of the pixel of the embodiments described above, since the pixel output line 142 is arranged in a wiring layer not originally used, it is necessary that the destination wiring layer originally has a room, or, in a case in which there is no room, it is necessary to add devising the wiring configuration, such as newly adding a wiring layer itself.

In A of FIG. 13, wiring structure of a case in which all of four pixel output lines 142-1 to 142-4 are arranged in one wiring layer (first wiring layer) is illustrated for comparison. In the wiring structure of A of FIG. 13, the pixel output lines 142-1 to 142-4 in the vertical direction are arranged in the first wiring layer, drive wirings 351-1, 351-2 in the horizontal direction, for example, are arranged in the second wiring layer, and wide width power supply wirings 352-1, 352-2 for power supply are arranged in a grid pattern in the third wiring layer. Incidentally, in the actual wiring structure of the pixel, there are lots of wirings other than these wirings; here, those wirings are omitted to simplify the description.

On the other hand, in the present technology, as illustrated in B of FIG. 13, the pixel output line 142-2 and the pixel output line 142-4 of four pixel output lines 142 are arranged in the first wiring layer, and the pixel output line 142-1 and the pixel output line 142-3 are arranged in the third wiring layer. Further, in the wiring structure of B of FIG. 13, of the wide width power supply wirings 352 for power supply arranged in the grid pattern in the third wiring layer of the wiring structure of A of FIG. 13, the wide width power supply wiring 352-1 in the horizontal direction and the wide width power supply wiring 352-2 in the vertical direction are arranged separately in the second wiring layer and the third wiring layer respectively.

That is, in the wiring structure of B of FIG. 13, the power supply wiring or the ground wiring (for example, wide width power supply wiring 352-2) and the pixel output lines 142 (for example, pixel output lines 142-1, 142-3) are arranged in the third wiring layer to be in the same direction in the vertical direction or the horizontal direction, and are arranged in a direction perpendicular to given wiring (for example, drive wirings 351-1, 351-2, wide width power supply wiring 352-1) arranged in the second wiring layer in which the pixel output lines 142 are not arranged.

By rearranging the wiring structure in this way, the plurality of pixel output lines 142 can be arranged separately in a plurality of wiring layers without increasing a new wiring layer.

As described above, in the seventh embodiment, in the pixel structure in which the plurality of pixel output lines 142 are provided per one column, the wiring structure is rearranged and then the plurality of pixel output lines 142 are arranged separately in the plurality of wiring layers, so that the influence caused by the increase in wiring density can be avoided.

(8) Eighth Embodiment

Figure 14:
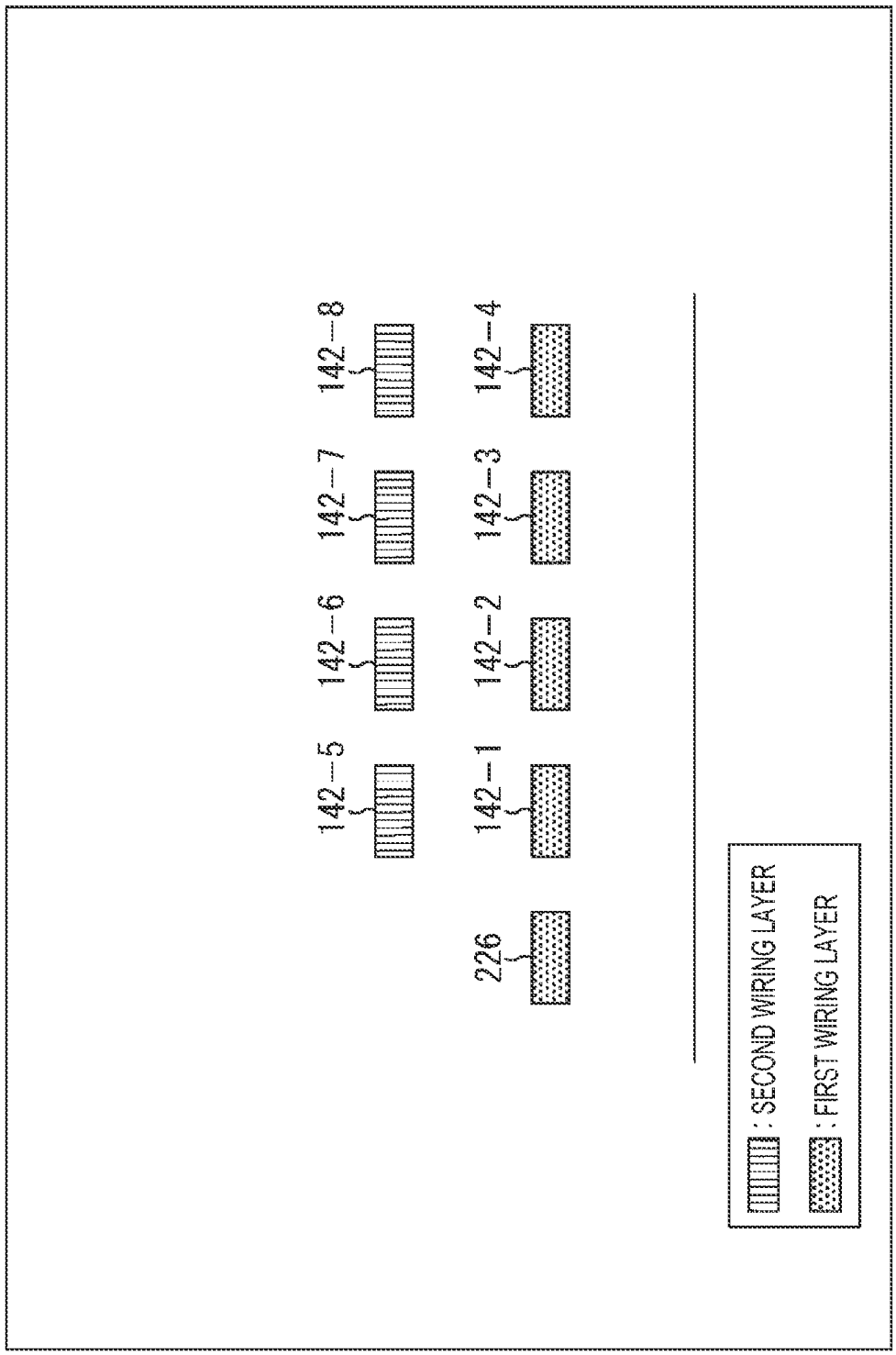
FIG. 14 is a cross-sectional view illustrating wiring structure of a pixel of an eighth embodiment.

FIG. 14 is a cross-sectional view illustrating wiring structure of a pixel of the eighth embodiment.

In the wiring structure of FIG. 14, similarly to the wiring structure of B of FIG. 7, the plurality of pixel output lines 142 are arranged separately in a plurality of wiring layers. That is, in the wiring structure of FIG. 14, the FD wiring 226 and the pixel output lines 142-1 to 142-4 are arranged in the first wiring layer, and the pixel output lines 142-5 to 142-8 are arranged in the second wiring layer. In a case of this wiring structure, reduction of the parasitic capacitance per each of the pixel output lines 142 and reduction of the coupling capacitance with the floating diffusion 226 cannot be performed; however, since wiring is performed by using two layers, the number of pixel output lines 142 that can be arranged can be increased to double compared to a case of using only one layer.

As described above, in the eighth embodiment, in the pixel structure in which the plurality of pixel output lines 142 are provided per one column, the plurality of pixel output lines 142 can be arranged separately in the plurality of wiring layers, so that the number of pixel output lines 142 that can be arranged can be increased.

Incidentally, the wiring structure in each of the first embodiment to the eighth embodiment described above is an example, and any configuration can be adopted for, for example, the number of wirings of the pixel output lines 142, the interval between wirings of the pixel output lines 142, the number of layers of the wiring layers, the combination of the wiring and the wiring layer, and the pixel structure. In addition, a configuration of combining at least two embodiments of the first embodiment to the eighth embodiment can be adopted.

With the present technology, in the pixel structure including the plurality of pixel output lines 142 per one column for aiming the increase in speed by parallel reading, the pixel output lines 142 are arranged separately in a plurality of wiring layers, so that a degree of freedom of wiring layout is increased, and further, reading speed of the pixel signal can be increased by increasing the number of the pixel output lines 142. In addition, with the present technology, by increasing the distance in a longitudinal direction, the parasitic capacitance, and coupling capacitance per one pixel output line 142 can be suppressed, and, further, electrical color mixing can also be suppressed. Further, with the present technology, the coupling capacitance with the other node such as the floating diffusion 226 can be suppressed, and color mixing control becomes possible, and, further, deterioration of the image quality can be suppressed, such as seen as the lateral stripes on the screen generated due to the fact that the coupling capacitance, that is, the amount of color mixing is different for each of the pixels 220.

<4. Configuration of Electronic Equipment>

Figure 15:
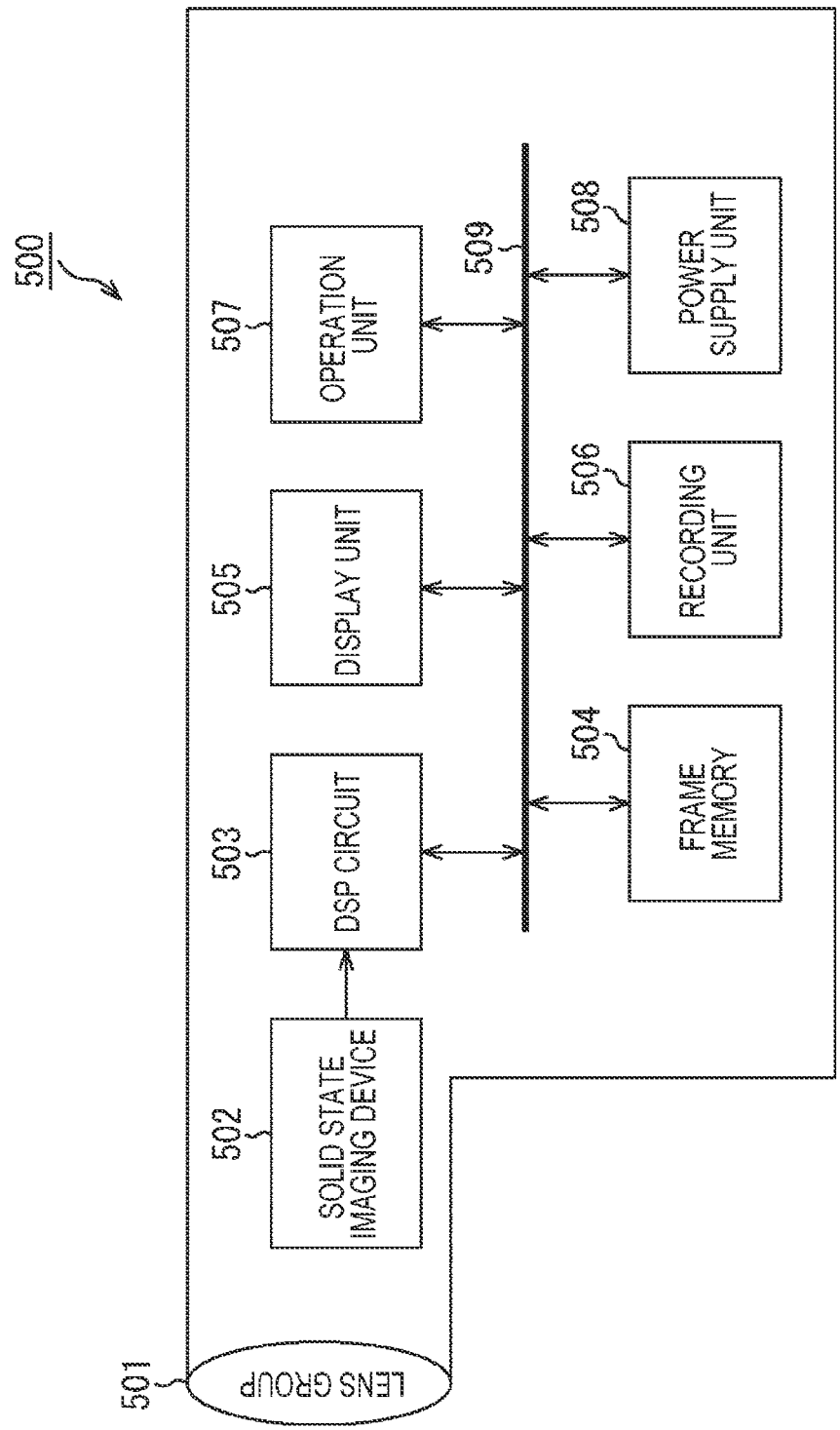
FIG. 15 is a diagram illustrating a configuration example of electronic equipment to which the present technology is applied.

FIG. 15 is a diagram illustrating a configuration example of an imaging apparatus as electronic equipment to which the present technology is applied.

An imaging apparatus 500 of FIG. 15 includes: an optical unit 501 including a lens group; a solid state imaging device 502 in which each configuration of the pixels 220 described above is adopted; and a Digital Signal Processor (DSP) circuit 503 being a camera signal processing circuit. In addition, the imaging apparatus 500 also includes: a frame memory 504; a display unit 505; a recording unit 506; an operation unit 507; and a power supply unit 508. The DSP circuit 503, frame memory 504, display unit 505, recording unit 506, operation unit 507, and power supply unit 508 are connected to each other via a bus line 509.

The optical unit 501 takes in incident light (image light) from a subject and forms an image on an imaging surface of the solid state imaging device 502. The solid state imaging device 502 converts the amount of light of the incident light formed on the imaging surface by the optical unit 501 into an electrical signal for each pixel, and outputs the electrical signal as the pixel signal. As the solid state imaging device 502, the solid state imaging device can be used such as the CMOS image sensor 100 according to the embodiments described above.

The display unit 505 includes a panel type display device such as a liquid crystal panel or an organic electro luminescence (EL) panel, and displays a moving image or a still image imaged by the solid state imaging device 502. The recording unit 506 records the moving image or the still image imaged by the solid state imaging device 502 in a recording medium such as a semiconductor memory.

The operation unit 507, under operation by a user, issues an operation command for various functions included in the imaging apparatus 500. The power supply unit 508 appropriately supplies various power supplies being operation power supplies of the DSP circuit 503, frame memory 504, display unit 505, recording unit 506, and operation unit 507, to those supply targets.

By using the CMOS image sensor 100 according to the embodiments described above as the solid state imaging device 502, while avoiding the influence caused by the increase in wiring density by providing the plurality of pixel output lines 142 per one column, the increase in reading speed of the pixel signal can be achieved.

In addition, in the embodiments described above, as an example, a case has been described in which the technology is applied to the CMOS image sensor in which pixels are arranged in a matrix form for detecting the signal charge depending on the amount of light of visible light as a physical quantity. However, the present technology is not limited to application to the CMOS image sensor, and can be applied to all solid state imaging device of a column method in which a column processing unit is arranged for each pixel column of a pixel array unit.

In addition, the present technology, not limited to application to the solid state imaging device for detecting distribution of the amount of incident light of visible light to image as an image, can be applied to the solid state imaging device for imaging distribution of the amount of incident of an IR-ray or an X-ray, or a particle as an image, and to all solid state imaging device (physical quantity distribution detection device) for detecting distribution of other physical quantities such as pressure and capacitance, as a broad sense of meaning, to image as an image, such as a fingerprint detection sensor.

Incidentally, the embodiment of the present technology is not limited to the embodiments described above, and can be variously modified without departing from the scope of the present technology.

In addition, the present technology can have a configuration as follows.

(1)
A solid state imaging device including
a pixel array block in which a plurality of pixels is two-dimensionally arrayed, each of the pixels including: a photoelectric conversion device; a plurality of transistors to be used for reading a signal from the photoelectric conversion device; and wiring for driving the transistors, wherein,
in the pixel array block, a plurality of pixel output lines is provided for each one column of the plurality of pixels two-dimensionally arrayed, and the plurality of pixel output lines from the pixels is arranged separately in a plurality of wiring layers.

(2)
The solid state imaging device according to (1), wherein pixel output lines adjacent to each other of the plurality of pixel output lines are respectively arranged in different wiring layers.

(3)
The solid state imaging device according to (2), wherein pixel output lines adjacent to each other of the plurality of pixel output lines are respectively arranged to be switched alternately in a first wiring layer and a second wiring layer.

(4)
The solid state imaging device according to (3), wherein a pixel output line arranged in the closest position to wiring of floating diffusion of the plurality of pixel output lines is arranged in a different wiring layer from a wiring layer of the floating diffusion.

(5)
The solid state imaging device according to any one of (1) to (4), including
structure in which, between the first wiring layer and the second wiring layer in which the plurality of pixel output lines is arranged, another wiring layer is sandwiched.

(6)
The solid state imaging device according to (5), wherein shield wiring is arranged in the other wiring layer.

(7)
The solid state imaging device according to any one of (1) to (6), wherein
power supply wiring or ground wiring and the pixel output line arranged in the first wiring layer to be in the same direction in a vertical direction or a horizontal direction, and are arranged in a direction perpendicular to given wiring arranged in the second wiring layer in which the pixel output line is not arranged.

(8)
The solid state imaging device according to any one of (1) to (4), wherein
dummy wiring is arranged in a periphery of the pixel output lines respectively arranged in different wiring layers, in order to make load capacitance of the pixel output lines uniform.

(9)
The solid state imaging device according to any one of (1) to (4), wherein
intervals between the pixel output lines are different from each other for each wiring layer in which the pixel output lines are arranged.

(10)
The solid state imaging device according to (1), wherein the pixel output lines are respectively wired to be switched alternately in different wiring layers via a contact.

(11)
The solid state imaging device according to (10), wherein a cycle of switching of wiring is changed such that wiring layers of the pixel output lines adjacent to each other of the plurality of pixel output lines are different from each other.

(12)
The solid state imaging device according to (3), wherein shield wiring is arranged between a pixel output line arranged in the closest position to wiring of floating diffusion of the plurality of pixel output lines and the wiring of the floating diffusion.

(13)
An imaging apparatus mounting a solid state imaging device including
a pixel array block in which a plurality of pixels is two-dimensionally arrayed, each of the pixels including: a photoelectric conversion device; a plurality of transistors to be used for reading a signal from the photoelectric conversion device; and wiring for driving the transistors, wherein,
in the pixel array block, a plurality of pixel output lines is provided for each one column of the plurality of pixels two-dimensionally arrayed, and the plurality of pixel output lines from the pixels are arranged separately in a plurality of wiring layers.

REFERENCE SIGNS LIST

100 CMOS image sensor
111 Pixel array block
112 Vertical drive circuit
114 CDS circuit
115 Horizontal drive circuit
142, 142-1 to 142-8 Pixel output line
220 Pixel
221 Photoelectric conversion device
222 Transfer transistor
223 Reset transistor
224 Amplifying transistor
225 Selection transistor
226 Floating diffusion
311-1 to 311-3 Dummy wiring
321 Shield wiring
331 Shield wiring
341-1, 341-2 Contact
500 Imaging apparatus
502 Solid state imaging device

What is claimed is:

1. An imaging device, comprising:
a pixel array block in which a plurality of pixels are two-dimensionally arrayed in rows and columns, each of the pixels including: a photoelectric conversion device; a plurality of transistors reading a signal from the photoelectric conversion device; and wiring for driving the plurality of transistors, wherein,
in the pixel array block, a plurality of pixel output lines are provided for each of the columns and the plurality of pixel output lines are arranged separately in a plurality of wiring layers,
wherein a pixel output line of the plurality of pixel output lines that is arranged in a position closest to a wiring of a floating diffusion is arranged in a different wiring layer from a wiring layer of the wiring of the floating diffusion, and
wherein a column signal is generated from the plurality of pixel output lines at a same time in parallel for each pixel output line of the plurality of pixel output lines.

2. The imaging device according to claim 1, wherein adjacent pixel output lines of the plurality of pixel output lines are respectively arranged in different wiring layers.

3. The imaging device according to claim 2, wherein the adjacent pixel output lines are respectively arranged to be switched alternately in a first wiring layer and a second wiring layer.

4. The imaging device according to claim 3, further comprising
structure in which, between the first wiring layer and the second wiring layer in which the plurality of pixel output lines are arranged, a third wiring layer is sandwiched.

5. The imaging device according to claim 4, wherein shield wiring is arranged in the third wiring layer.

6. The imaging device according to claim 1, wherein power supply wiring or ground wiring and the plurality of pixel output lines are arranged in a first wiring layer to be in the same direction in a vertical direction or a horizontal direction, and are arranged in a direction perpendicular to given wiring arranged in a second wiring layer in which the plurality of pixel output lines are not arranged.

7. The imaging device according to claim 1, wherein dummy wiring is arranged in a periphery of the plurality of pixel output lines respectively arranged in different wiring layers, in order to make load capacitance of the plurality of pixel output lines uniform.

8. The imaging device according to claim 1, wherein intervals between the plurality of pixel output lines are different from each other for each wiring layer in which the plurality of pixel output lines are arranged.

9. The imaging device according to claim 1, wherein the plurality of pixel output lines are respectively wired to be switched alternately in different wiring layers via a contact.

10. The imaging device according to claim 9, wherein a cycle of switching of wiring is changed such that wiring layers of adjacent pixel output lines of the plurality of pixel output lines are different from each other.

11. The imaging device according to claim 3, wherein shield wiring is arranged between the wiring layer of the pixel output line arranged in the position closet to the wiring of the floating diffusion and the wiring layer of the wiring of the floating diffusion.

12. The imaging device according to claim 1, wherein each of the plurality of pixel output lines for each column is respectively arranged separately in different wiring layers.

13. The imaging device according to claim 1, wherein at least two of columns have the column signals that are generated at a same time in parallel for at least two of the plurality of pixel output lines that are arranged separately in different layers of the plurality of wiring layers.

14. An imaging apparatus, comprising:
an imaging device mounted on the imaging apparatus, the imaging device comprising:
a pixel array block in which a plurality of pixels are two-dimensionally arrayed in rows and columns, each of the plurality of pixels including: a photoelectric conversion device; a plurality of transistors reading a signal from the photoelectric conversion device; and wiring for driving the plurality of transistors, wherein, in the pixel array block, a plurality of pixel output lines are provided for each of the columns and the plurality of pixel output lines are arranged separately in a plurality of wiring layers,
wherein a pixel output line of the plurality of pixel output lines that is arranged in a position closest to a wiring of a floating diffusion is arranged in a different wiring layer from a wiring layer of the wiring of the floating diffusion, and
wherein a column signal is generated from the plurality of pixel output lines at a same time in parallel for each pixel output line in the plurality of pixel output lines.

* * * * *